United States Patent [19]

Toyoda et al.

[11] 4,420,773
[45] Dec. 13, 1983

[54] ELECTRONIC PHOTOGRAPHIC CAMERA

[75] Inventors: Kenji Toyoda, Chigasaki; Takao Watanabe, Koshigaya; Hideya Inoue, Kawasaki; Atsumi Kasuya, Tokyo; Yutaka Ichihara, Yokohama; Akira Miyaji, Tokyo, all of Japan

[73] Assignee: Nippon Kogaku K.K., Tokyo, Japan

[21] Appl. No.: 275,403

[22] Filed: Jun. 18, 1981

[30] Foreign Application Priority Data

| Jun. 30, 1980 [JP] | Japan | 55-89506 |
| Jul. 4, 1980 [JP] | Japan | 55-91275 |
| Jul. 7, 1980 [JP] | Japan | 55-92350 |
| Sep. 25, 1980 [JP] | Japan | 55-133539 |
| Nov. 29, 1980 [JP] | Japan | 55-168170 |

[51] Int. Cl.$^3$ .................................................. H04N 5/76
[52] U.S. Cl. ................................. 358/335; 358/906; 358/213; 360/33.1; 360/35.1
[58] Field of Search ............... 358/906, 213, 194, 139, 358/335, 224, 228; 354/40; 360/33.1, 35.1, 14.1

[56] References Cited

U.S. PATENT DOCUMENTS

| 3,931,463 | 1/1976 | Levine | 358/213 |
| 4,025,945 | 5/1977 | Bridgewater | 358/194.1 |
| 4,131,919 | 12/1978 | Lloyd | 358/906 |
| 4,163,256 | 7/1979 | Adcock | 358/906 |
| 4,206,483 | 6/1980 | Nakamura | 360/33.1 |
| 4,262,301 | 4/1981 | Erlichman | 358/906 |
| 4,303,322 | 12/1981 | Someya | 358/224 |
| 4,327,378 | 4/1982 | Tanaka | 358/213 |

*Primary Examiner*—Alan Faber
*Attorney, Agent, or Firm*—Fitzpatrick, Cella, Harper & Scinto

[57] ABSTRACT

An electronic photographic camera includes an imaging optical system operable to be focused to an object to be photographed, a solid state imaging sensing device including a plurality of light-receiving elements disposed in the imaging plane of the imaging optical system and capable of producing a charge corresponding to the quantity of incident light and accumulating the charge therein, first transfer means having a first output terminal and adapted to transfer the charge accumulated in each of the elements separately to the first output terminal, and second transfer means having a second output terminal and adapted to transfer the charges produced in some or all of the elements collectively to the second output terminal, and metering means for measuring the brightness of the object from the charge transferred by the second transfer means.

46 Claims, 40 Drawing Figures

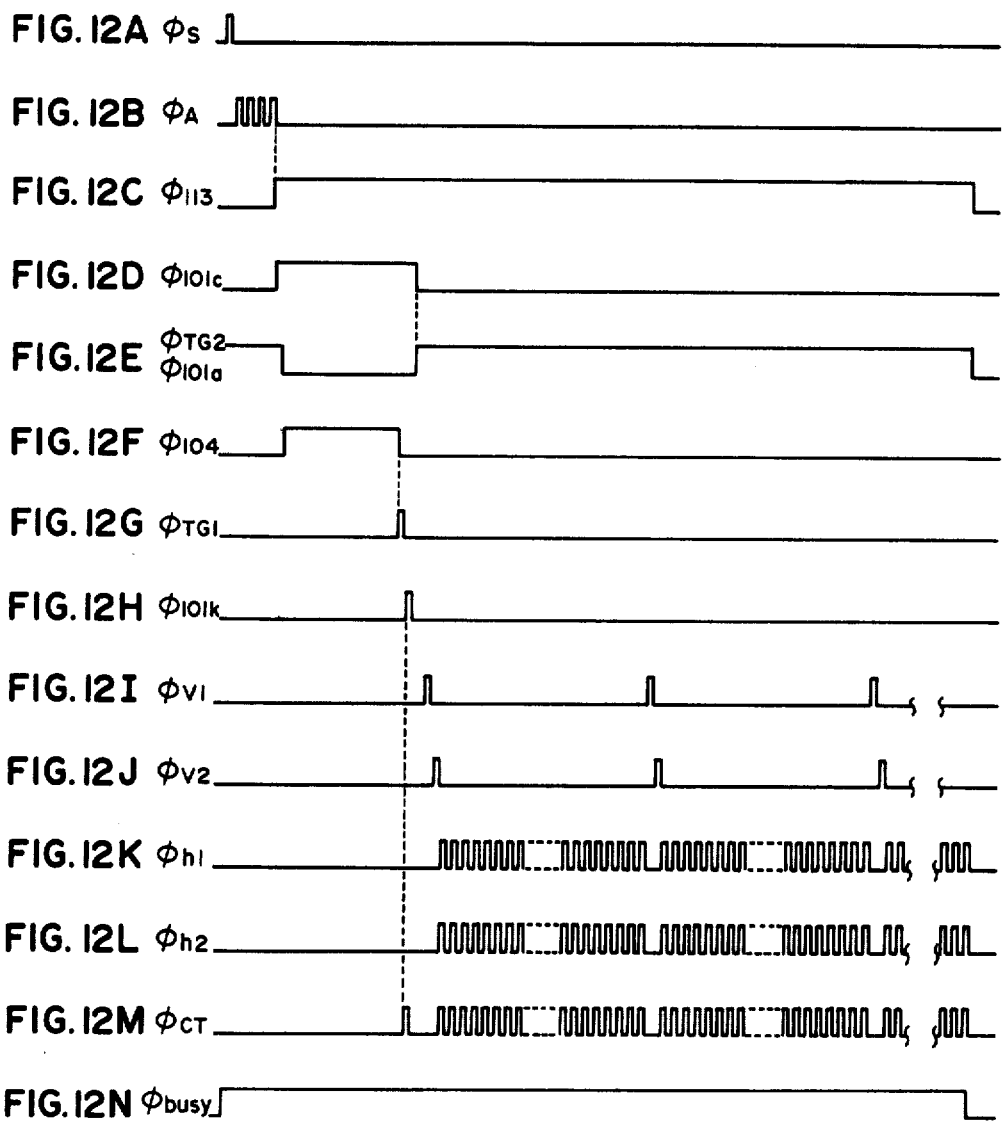

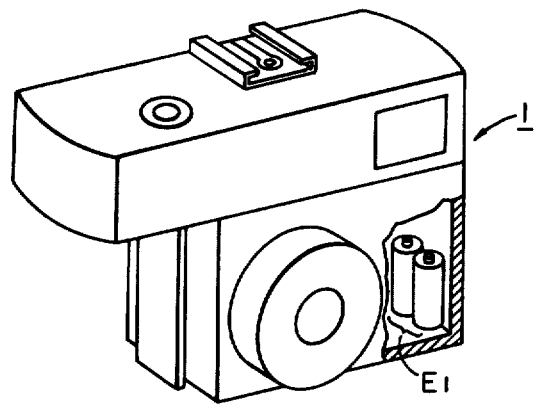
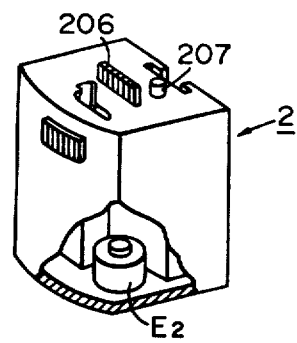
FIG. 15A    FIG. 15B
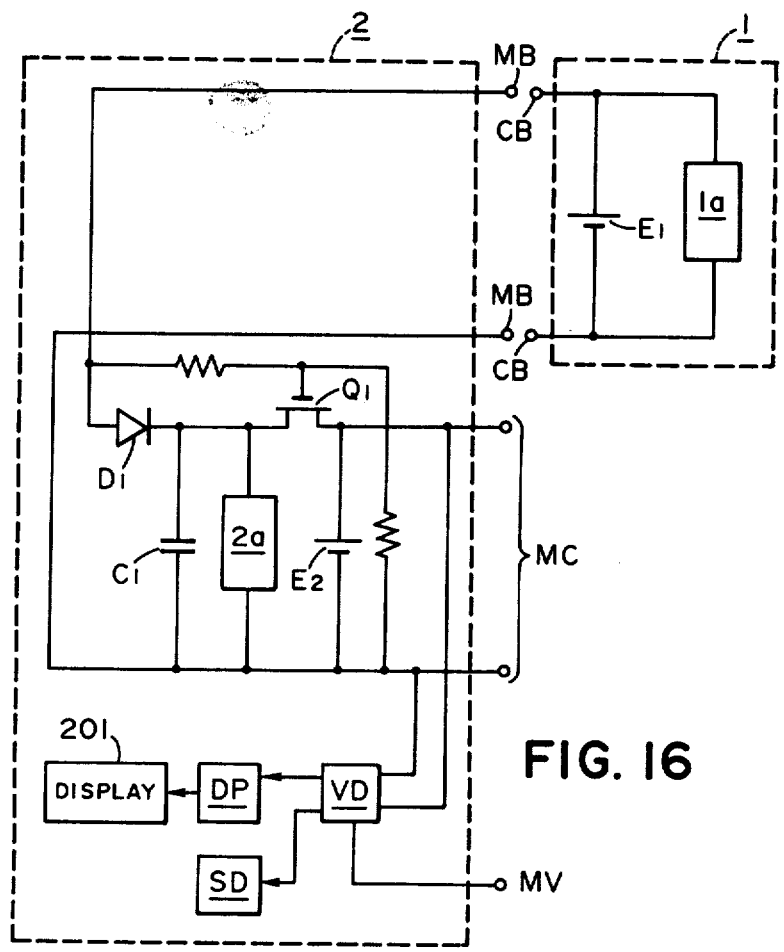
FIG. 16

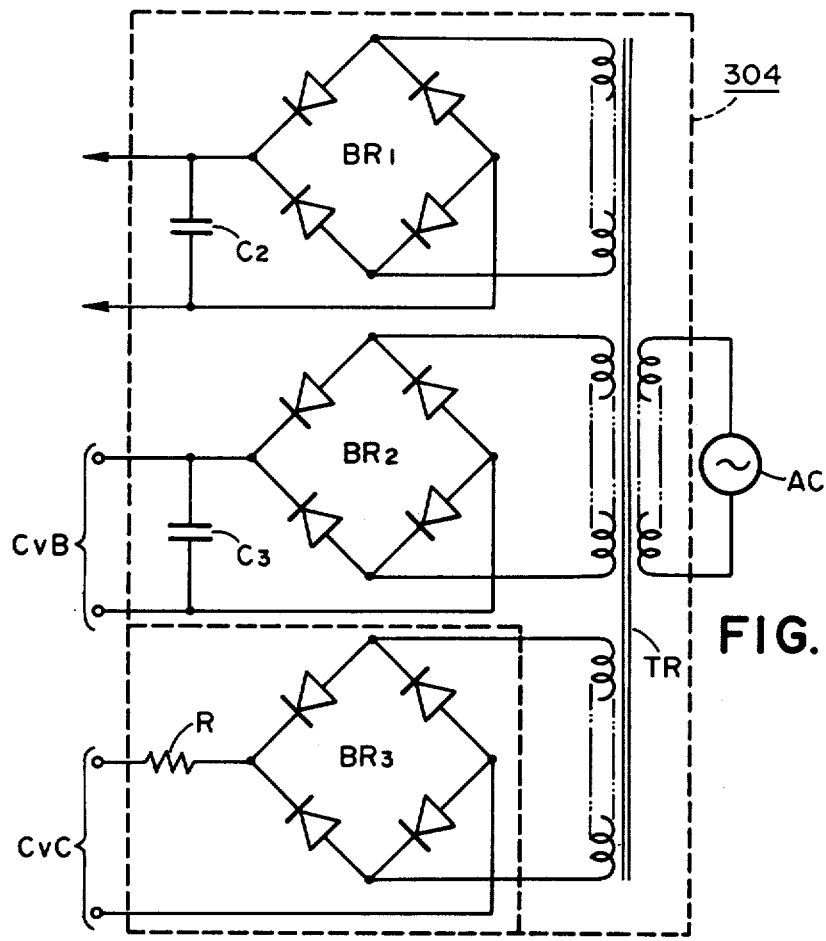
FIG. 18
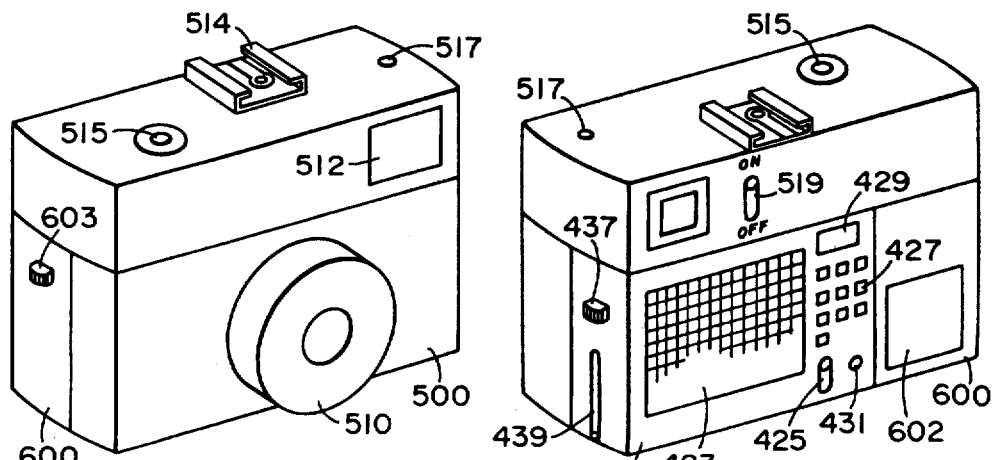
FIG. 19
FIG. 20

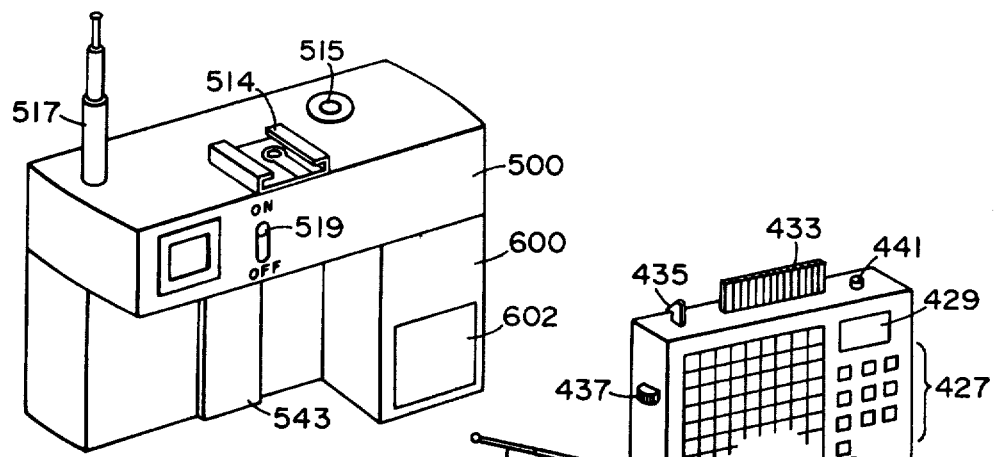
FIG. 21A
FIG. 21B
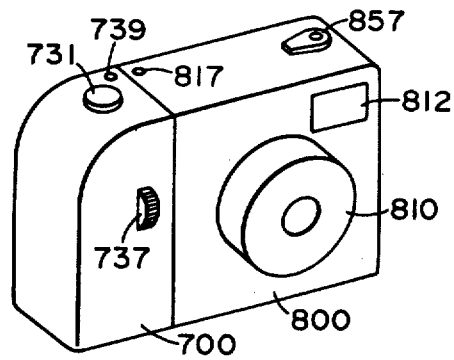
FIG. 22
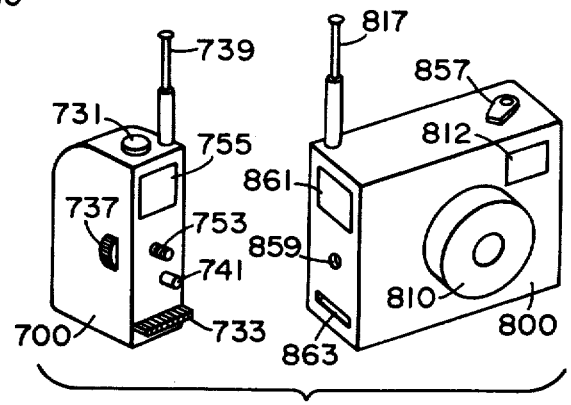
FIG. 23
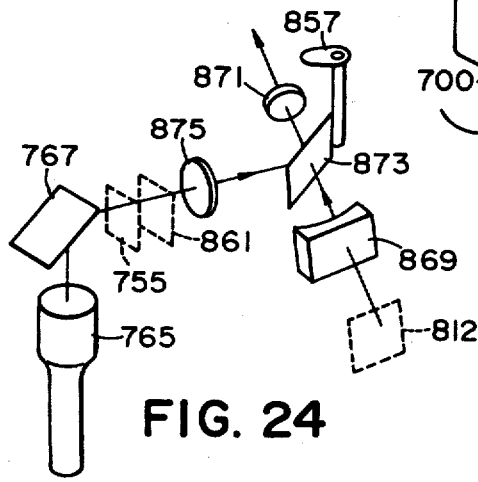
FIG. 24

ELECTRONIC PHOTOGRAPHIC CAMERA

BACKGROUND OF THE INVENTION

1. Field of the Invention

This invention relates to an electronic photographic camera for electrically recording an object image, and particularly to an electronic photographic camera capable of displaying the electrically recorded object image as a still picture or a moving picture later, and more particularly to an electronic photographic camera using a solid state imaging sensing device.

2. Description of the Prior Art

An electronic camera using a solid state imaging sensing device such as a charge coupled device (CCD) is known from Japanese Laid-open Patent Application Gazette No. 13632/1979, where the priority of U.S. application Ser. No. 891,705 now U.S. Pat. No. 4,262,301, on Mar. 30, 1978 is claimed.

Such an electronic camera is designed such that optical images are converted into electronic image signals, whereby the optical images are represented in the form of electronic data and these signals are transferred so as to be stored in a storing device.

On the other hand, in the field of the still camera of the conventional type wherein optical images are formed on a photosensitive film and recorded thereon through chemical processes, technical improvements have already been sufficiently achieved in compactness of apparatus, operability for taking a photograph etc. However, it may be said that it is impossible from the presently proposed techniques alone to provide an electronic camera which is as light in weight and compact in size as such a conventional still camera and which has good operability desired for actually taking a photograph.

SUMMARY OF THE INVENTION

It is a primary object of the present invention to provide improvements in the electronic photographic camera of the above-described type.

It is an additional object of the present invention to provide an electronic photographic camera having a device for object photometering which can use the photoelectric output of a solid state imaging sensing device as continuous metering information. For this purpose, the electronic photographic camera of the present invention includes a solid state imaging sensing device including a plurality of light-receiving elements for accumulating therein the charges produced in accordance with the intensity of incident light and means for transferring the charges accumulated in the elements successively as image signals to an output terminal, the solid state imaging sensing device further having means for transferring the charges produced from all or some of the light-receiving elements collectively to another output terminal, and means for obtaining a metering signal from said another output terminal during metering. With such a construction, it becomes possible to use the image signals of the imaging sensing device as metering information and the necessity of additionally providing a photoelectric element serving only for the purpose of object metering is eliminated.

It is another object of the present invention to provide an electronic photographic camera which enables it to be confirmed that the signal of an optical image converted into an electronic image signal has been transferred to a storing device.

It is still another object of the present invention to provide an electronic photographic camera in which whether the signal of the electronic image has already been stored in the storing device can be detected. For this purpose, the electronic photographic camera of the present invention includes means for transferring another signal distinguishable from the electronic image signal prior to the transfer of the electronic image signal into the storing device and for detecting said transferred another signal.

It is yet still another object of the present invention to provide an electronic photographic camera which is provided with means for ensuring the transfer of the image signal to the storing device, whereby the storing device is made arbitrarily separable from an image pickup device.

It is a further object of the present invention to provide an electronic photographic camera system including an additional device for realizing a compact and light-weight electronic photographic camera. The system of the present invention includes a converter connected to the camera to transfer the electronic image signal stored in the storing device to an extraneous storing device, and also includes means for charging a power supply battery provided in the camera during the connection between the camera and the converter.

It is still a further object of the present invention to provide an electronic photographic camera system in which the camera is remote-operable while an object image to be photographed is observed. For this purpose, the electronic photographic camera system of the present invention includes a camera including an image pickup device for converting the optical image of an object to be photographed into an electronic image signal, and a monitor device for reproducing the image of the object from the electronic image signal and displaying the same, the monitor device including a remoteoperating release means for releasing the camera's shutter when the monitor device is separated from the camera.

The invention will become more fully apparent from the following detailed description thereof taken in conjunction with the accompanying drawings.

BRIEF DESCRIPTION OF THE DRAWINGS

FIGS. 12A–12N are timing charts of important pulses for controlling the photographing sequence of the camera.

FIGS. 15A and 15B are partly broken-away views showing the power supply batteries contained within the image pickup unit and the storing unit, respectively, of the camera of FIGS. 1 and 2.

FIG. 16 is a circuit diagram of the power source circuit system of the image pickup unit and the storing unit.

FIG. 18 is a circuit diagram of the power source of the converter.

FIGS. 19 and 20 are perspective views showing the appearance of a camera according to still another embodiment of the present invention.

FIGS. 21A and 21B are perspective views showing the camera of FIGS. 19 and 20 as separated into a body and a monitor device.

FIG. 22 is a perspective view showing the appearance of a camera according to yet still another embodiment of the present invention.

FIG. 23 is a perspective view showing the camera of FIG. 22 as separated into a body and a monitor device.

FIG. 24 is an arrangement view showing the optical system of the camera of FIG. 22.

DESCRIPTION OF THE PREFERRED EMBODIMENTS

Figure 1:
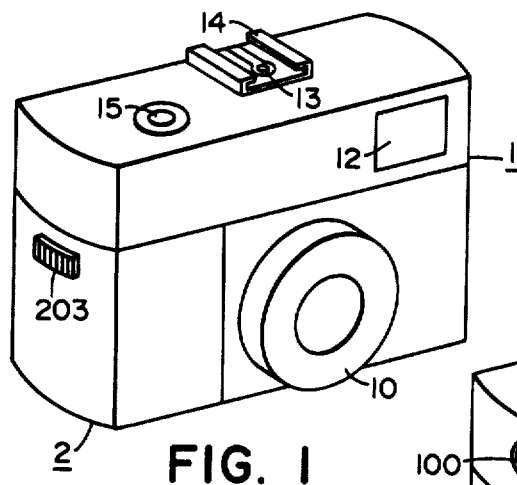
FIGS. 1 and 2 are perspective views showing the outside appearance of a camera according to an embodiment of the present invention.
Figure 2:
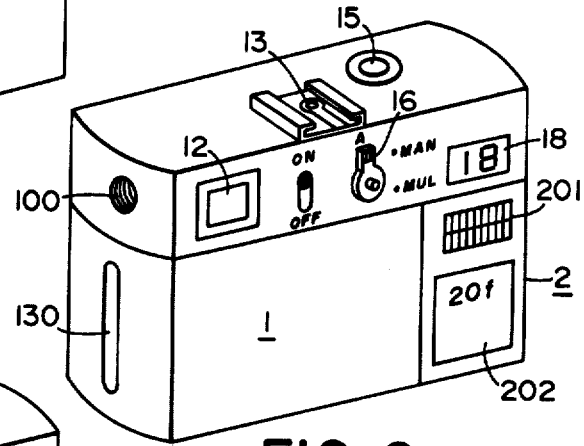
Figure 3A:
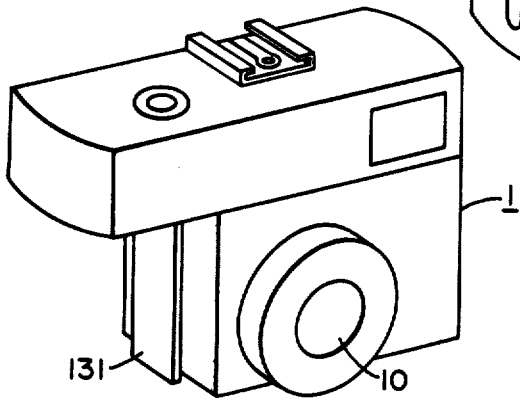
FIGS. 3A and 3B are perspective views showing the camera of FIGS. 1 and 2 as separated into an image pickup unit and a storing unit.
Figure 3B:
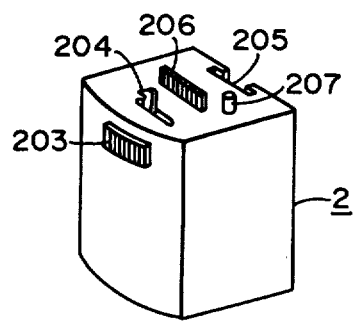

FIGS. 1 and 2 show the appearance of an embodiment of the electronic camera using the present invention. This camera comprises an image pickup unit 1 for photoelectrically converting an object image into a still image signal, and a storing unit 2 provided with memory cells corresponding to 20 frames each for storing therein one frame of still image information. These two units are separable from each other as shown in FIGS. 3A and 3B.

Figure 4:
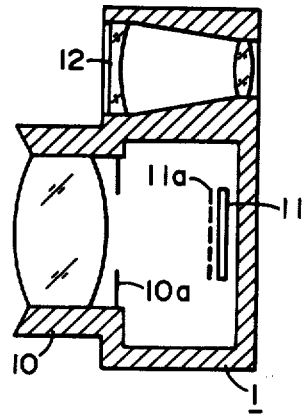
FIG. 4 is a longitudinal cross-sectional view of the camera.

A phototaking lens 10 is mounted on the front face of the image pickup unit 1 and, as shown in the cross-sectional view of FIG. 4, the lens 10 forms the object image on the image pickup surface of an image pickup device 11 disposed within the image pickup unit 1. A diaphragm 10a is disposed adjacent to the lens 10, and a color resolving mosaic filter 11a is disposed on the front face of the image pickup device 11. Further, a finder 12 extending from the front face to the rear face of the image pickup unit 1 to define a photographing view field is provided on the image pickup unit 1 and, in FIG. 1, on the upper surface thereof, there are provided an accessory shoe 14 provided with a contact 13 for mounting thereon an extraneous light source such as a flash device and a release button 15. When the release button 15 is depressed shallowly, a power supply switch inserted in a power supply circuit is closed, whereby power supply is effected. Along with this, metering operation is effected. When the release button 15 is depressed deeply, the power supply switch remains closed and further a photographing sequence is initiated. The photographing sequence, once initiated, is not discontinued even if the depression of the release button 15 is released in the course thereof. The closing of the power supply switch is maintained until the photographing sequence is terminated. In FIG. 2, on the rear face of the image pickup unit 1, there are provided a mode selecting lever 16 for selecting one of the mode of automatically accessing the address of the memory of the storing unit 2, the mode of manually accessing such address and the multi-exposure mode, a push button 17 for manual access, a 7-segment display device 18 such as liquid crystal for displaying the address of the memory being accessed, and a switch 19 for rendering a sound alarm device inoperative. Further, on the side surface of the image pickup unit 1, there are disposed a mounting screw 100 for mounting extraneous accessories such as a data photographing device and an electronic monitor device for monitoring the object image, and a connector 130 for the accessories. On the rear face of the storing unit 2, as shown in FIG. 2, there are provided a display device 201 such as liquid crystal or an electrochromic element for displaying the address of the memory used, and a label 202 on which is printed the memory capacity (the total number of memories, namely, the number of frames that can be stored). On the side surface of the storing unit, as shown in FIG. 3B, there is a mounting-dismounting slider 203. When this is shifted rightwardly, a mounting-dismounting hook 204 projected on the upper surface of the storing unit 2 slides in the same direction and becomes disengaged from a fixed hook (not shown) located at a corresponding portion of the image pickup unit, thus permitting the storing unit 2 to be separated from the image pickup unit 1. The storing unit 2 is provided with a T-shaped groove 205 which, during mounting or dismounting, may be engaged by a guide member 131 on the image pickup unit side to guide the latter. Also provided on the upper surface of the storing unit 2 are a connector 206 and a pin 207. The connector 206 is connected to a corresponding connector (not shown) of the image pickup unit 1 to transmit an electrical signal therebetween. The pin 207 serves to mechanically transmit the memory capacity of the storing unit to the image pickup unit 1.

Figure 5:
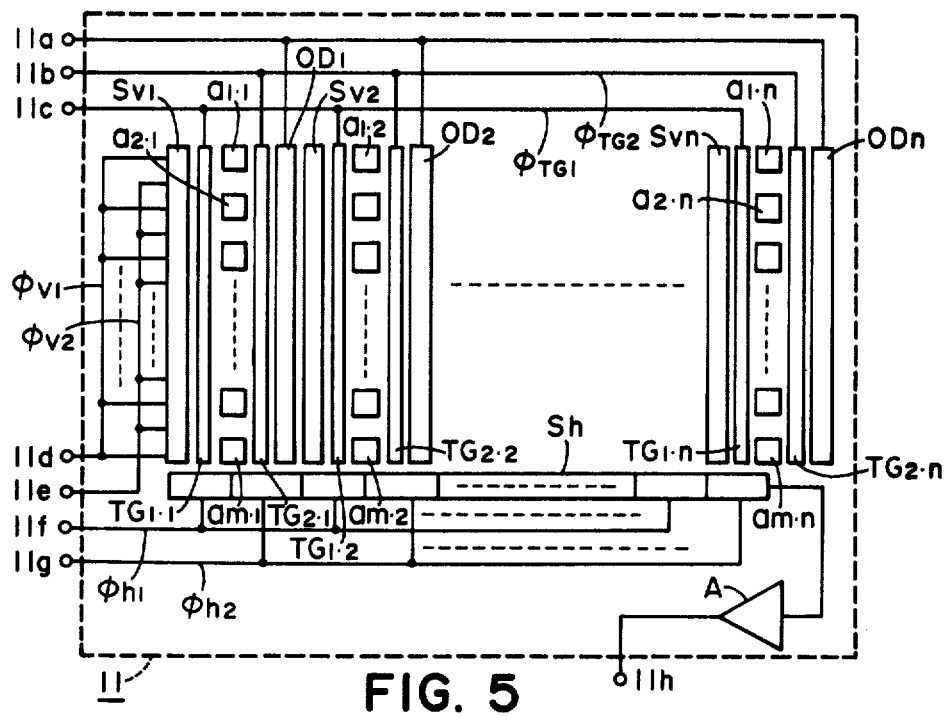
FIG. 5 is a schematic view showing the construction of a solid state imaging sensing device according to an embodiment of the present invention.

FIG. 5 illustrates the interior structure of the image pickup device 11 of the image pickup unit 1. This is a CCD image pickup device using the so-called interline type of charge coupled device (CCD), in which light-receiving elements $a_{1,1}, a_{1,2}, \ldots, a_{1,n}, a_{2,1}, \ldots, a_{2,n}, \ldots, a_{m,1}, a_{m,2}, \ldots, a_{m,n}$ together constitute a light-receiving portion arranged in the form of m×n matrix. The total number of light-receiving elements, namely, the number of image elements, may desirably be of the order of $10^6$. Transfer gates $TG_{1,1}$ and $TG_{2,1}$ are disposed on the opposite sides of the row of these light-receiving elements, for example, $a_{1,1}, a_{2,1} \ldots, a_{m,1}$. When a transfer signal $\phi_{TG1}$ is applied through a terminal 11c, the gate $TG_{1,1}$ transfers to a longitudinal CCD analong shift register $S_{V1}$ a charge corresponding to the quantity of incident light accumulated in each element. On the other hand, when a transfer signal $\phi_{TG2}$ is applied through a terminal 11b, the gate $TG_{2,1}$ transfers said charge to the area $OD_1$ of an overflow drain. The electrical potential of the transfer gate $TG_{2,1}$ is somewhat lower than the potential between the light-receiving elements and the potential between the bits of the longitudinal shift register $S_{V1}$ even when the transfer signal $\phi_{TG2}$ is not applied. Accordingly, any charge overflowing from the potential well of the light-receiving element flows in the direction of lower barrier, namely, into overflow drain $OD_1$, thus preventing occurrence of a blooming phenomenon. This also holds true of the other rows of light-receiving elements. The charge transferred to the overflow drain $OD_1, \ldots, OD_n$ is put out from an output terminal 11a, the transfer signal $\phi_{TG2}$ to the transfer gates $TG_{2.1}, \ldots, TG_{2.n}$ is input to the input terminal 11b, and the transfer signal $\phi_{TG1}$ to the transfer gates $TG_{1.1}, \ldots, TG_{1.n}$ is input to the input terminal 11c.

The charges transferred to the longitudinal shift registers $S_{v1}, \ldots, S_{vn}$ by the transfer signal $\phi_{TG1}$ to the transfer gates $TG_{1.1}, \ldots, TG_{1.n}$ are successively transferred downwardly by longitudinal transfer pulses $\phi_{v1}$ and $\phi_{v2}$ input through input terminals 11d and 11e and are delivered into each bit of a lateral shift register $S_h$. The charges are then transferred rightwardly by lateral transfer pulses $\phi_{h1}$ and $\phi_{h2}$ input through input terminals 11f and 11g, and are amplified by a sense amplifier A and taken out from a terminal 11h.

Figure 6:
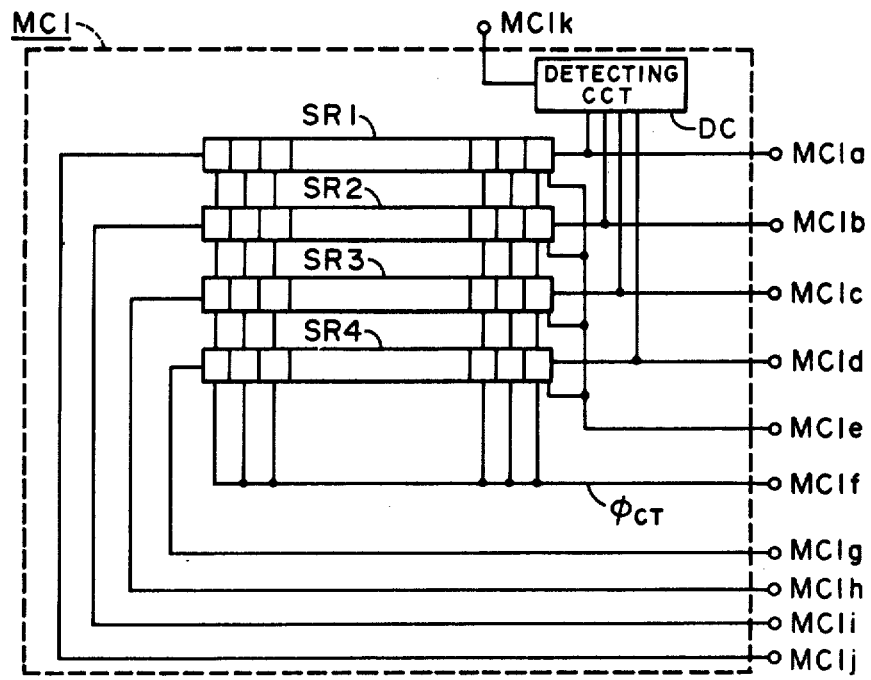
FIG. 6 is a circuit diagram of a memory included in the storing unit.
Figure 7:
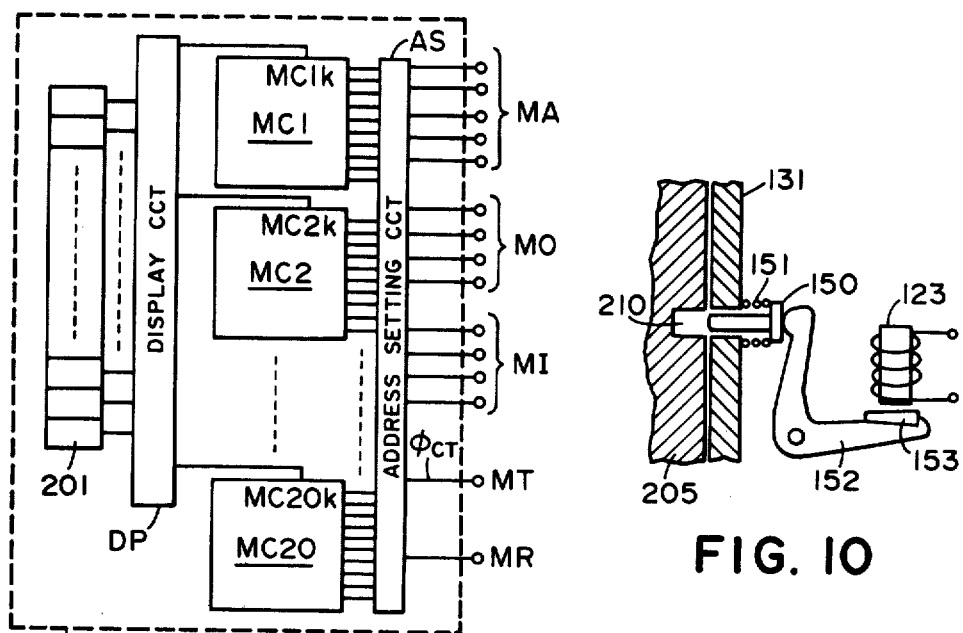
FIG. 7 is a circuit diagram of the storing unit.

FIGS. 6 and 7 show the circuit construction of the storing unit 2. FIG. 6 shows the interior of a memory MC1 corresponding to one frame, and this comprises four rows of shift registers SR1, SR2, SR3 and SR4. Each shift register row has a stage number (bit number) equal to the total number of light-receiving elements included in the image pickup device 11 (namely, m×n), plus 1. The information of each shift register row is transferred from left to right, as viewed in FIG. 6, by a clock pulse $\phi_{CT}$ input from a terminal MC1f. One image element corresponds to one bit in the shift register SR1 and each one bit in the shift registers SR2, SR3 and SR4 corresponding in position thereto, thus total four bits. The concentration information of one image element is expressed by the digital amount expressed by the four bits. The quantity of information that can be expressed by four bits has sixteen stages, 0000–1111, as measured in the binary scale, and among these, eleven stages are used for the expression of concentration and the remaining five stages are used for the control information of this memory. The information from the image pickup unit 1 is input to each shift register via input terminals MC1g, MC1h, MC1i and MC1j and delivered rightwardly by the clock pulse $\phi_{CT}$ from terminal MC1f, but said control information signal is input for the first stage. There are five kinds of this signal, i.e., 1111, 1110, 1101, 1011 and 0111. These show the start position of a series of image signals and will hereinafter be referred to as start signals. Such five kinds of start signals have been prepared to prevent occurrence of a hindrance even if noise comes into one of the four rows of shift registers so that one of the places becomes 0 when there should originally be 1111. Accordingly, this also holds true even if the five kinds, i.e. 0000, 0001, 0010, 0100 and 1000 are adopted as the start signal.

Now, following this start signal, image signals are input from the image pickup device 11 and successively delivered by the clock pulse $\phi_{CT}$, and when all of the image signals corresponding to one frame are delivered, the start signal is input to the rightmost (1+m×nth stage) bit. Thereupon, the aforementioned start signal is put out at the output terminals MC1a, MC1b, MC1c and MC1d of each shift register row and therefore, if this is detected and the clock pulse $\phi_{CT}$ from terminal MC1f is stopped, the image signals corresponding to one frame are stored in the four rows of shift registers. A detecting circuit DC is connected to the rightmost bit of these shift registers and it detects when one of the five kinds of start signal appears at the output, and puts out at an output terminal MC1k and output signal indicating that the image signals have been transferred to the memory MC1, namely, the memory MC1 has been used. Also, by a signal being input from terminal MC1e to the last (rightmost) bit of the shift register, the start signal recorded therein can be reset. As will fully be described later, this function is used when the frame of an address having failed in photography is reused or when multi-exposure is effected.

A plurality of memories each corresponding to one frame as described above together constitute the storing unit 2, an example of which is shown in FIG. 7. Twenty memories Mc (MC1-MC20) as shown in FIG. 6 are disposed and their input and ouput terminals, except the output terminals MC1k-MC20k of the detecting circuit DC, are all connected to an address setting circuit A5. An address input terminal MA, an output terminal MO, an input terminal MI, an input terminal MT of transfer clock pulse $\phi_{CT}$ and a reset terminal MR are disposed in the address setting circuit AS. When the signal $\phi_A$ of the address of a certain memory, for example, such a signal as will select the momory of address 1, is input to the address input terminal MA, the output terminals MC1a-MC1d of the memory C1M of address 1 are selectively connected to the output terminal MO, the input terminals MC1g-MC1j of the memory are selectively connected to the input terminal MI, the clock terminal MC1f of the memory is selectively connected to terminal MT, and the reset terminal MC1e of the memory is selectively connected to terminal MR, and the memory MC1 of address 1 is accessed.

Figure 8:
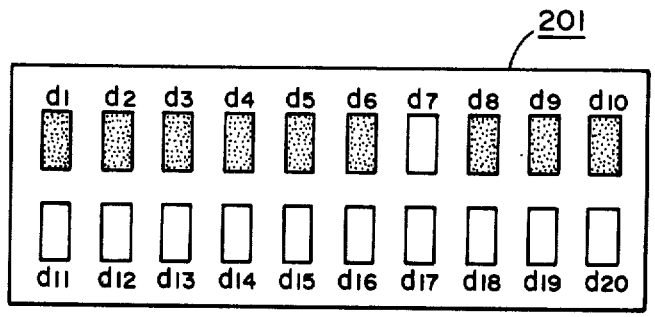
FIG. 8 is a front view showing the appearance of the display portion of a display device.

On the other hand, the output terminals MC1k-MC20k of the detecting circuit DC are all connected to a display circuit DP, the output of which drives a display device 201 for displaying the memory from which the start signal is being put out, namely, the memory used. This device 201 includes an electro-optical element such as liquid crystal or an electrochromic element, and has such an appearance as shown in FIG. 8. In the present example, it is the display device of a storing unit having the memory capacity of "20 frames" and has 20 segments $d_1$-$d_{20}$ of liquid crystal or electrochromic arranged therein. Amoung these segments, the segment corresponding to the used memory receives the output signal of the detecting circuit DC and is colored thereby. In this examples, the memories MC1-MC6 and MC8-MC10 of addresses 1-6 and 8-10 are the used memories.

Figure 9:
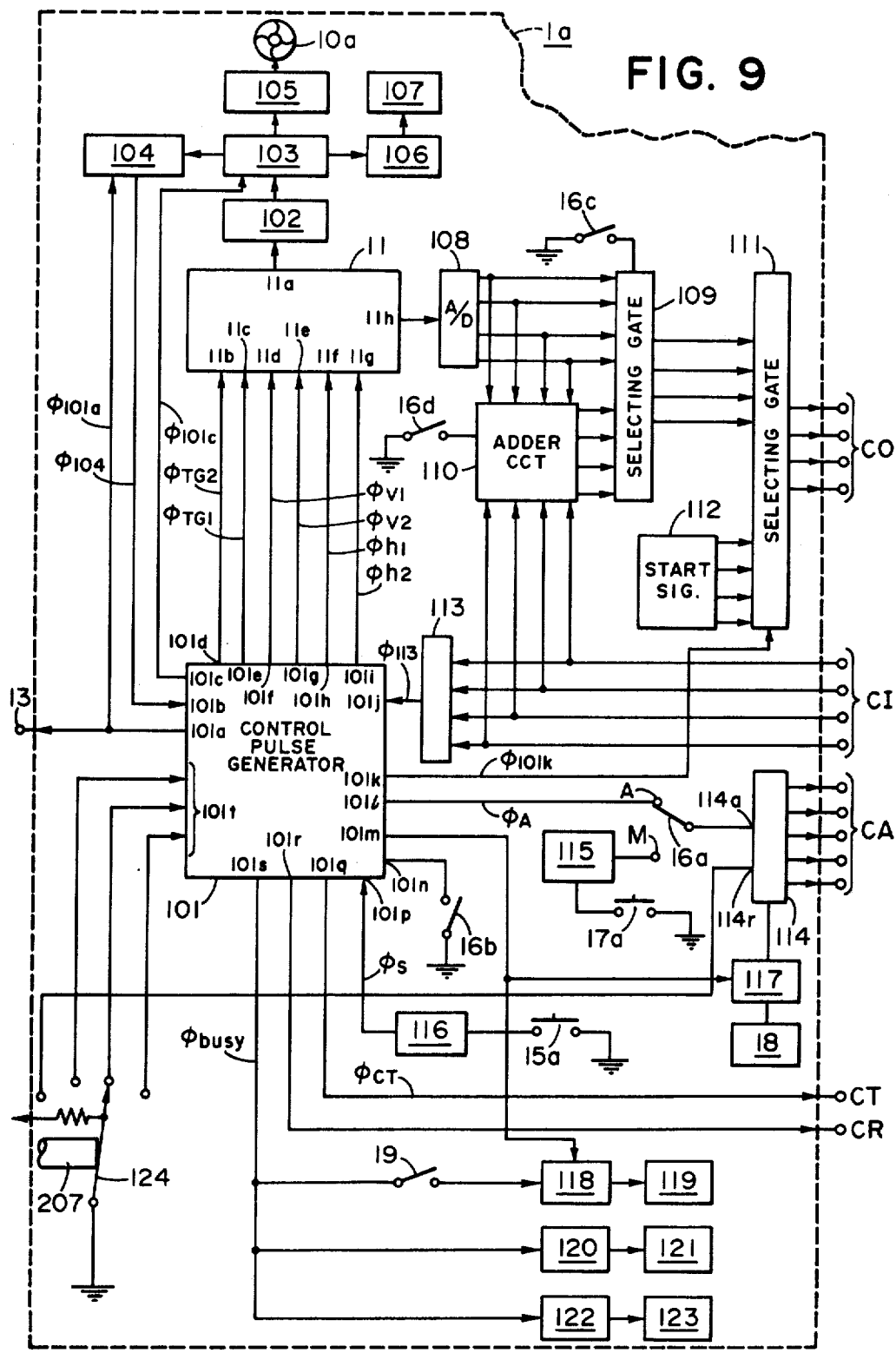
FIG. 9 is a circuit diagram of the image pickup unit.

FIG. 9 shows the circuit system of the image pickup unit 1. The image pickup device 11 as shown in FIG. 5 has the output terminal 11a of the overflow drain thereof connected to the input terminal of a metering circuit 102 including a photocurrent amplifier. The output of the metering circuit is connected to the input terminal of a memory operating circuit 103, which calculates an exposure time value and an aperture value providing a proper exposure, on the basis of the output of the metering circuit 102. A control pulse generating circuit 101 generates various pulses which govern the photographing sequence and, upon reception of a signal $\phi_{101C}$ from the terminal 101C thereof, the circuit 103 stores therein the output signal of the metering circuit 102. The memory operating circuit 103 has three output terminals, and a first output of this circuit 103 is input through a first terminal to a display circuit circuit 106, the output of which drives a display device 107 including a display element such as LED or liquid crystal provided within the finder, to display the exposure time, the aperture value, etc. A second output of the operating circuit 103 is input through a second terminal to a diaphragm control circuit 105, the output of which controls the diaphragm 10a of the phototaking lens. A third output of the circuit 103 is input through a third terminal to a time counting circuit 104, which receives the signal $\phi_{101a}$ from the output terminal 101a of the pulse generating circuit 101 and sends an exposure termination signal into the input terminal 101b of the pulse generating circuit 101 in a time corresponding to the output of the circuit 103 after that point of time.

The input terminals 11b–11g of the image pickup device 11 are respectively connected to the output terminals 101d–101i of the pulse generating circuit 101 to receive the aforementioned various control pulses $\phi_{TC2}$, $\phi_{TG1}$, $\phi_{V1}$, $\phi_{V2}$, $\phi_{h1}$ and $\phi_{h2}$ for driving the image pickup device 11. The output terminal 11h of the image pickup device 11 is connected to an A/D converter circuit 108, where an analog signal corresponding to the intensity of light of each image element (each light-receiving element) is converted into a 4-bit digital signal and is sent therefrom into a selecting gate 109. An adder circuit 110, which is used during multi-exposure, sums up the output of the A/D converter circuit 108 and the image signal input thereto from the storing unit 2 through input terminal CI and divides the sum by 2. That is, it takes the arithmetical mean of the two and applies the signal thereof to the selecting gate 109. A switch 16d is adapted to be opened and closed in response to the mode selecting lever 16 of FIG. 2 and, when the lever 16 is in the position of multi-exposure MUL, the switch 16d is closed to render the adder circuit 110 operative, and during the other time, the switch 16d is opened to render the adder circuit 110 inoperative. A switch 16c is also adapted to be opened and closed in response to the lever 16 and, when the lever 16 is in the position MUL, the switch 16c is closed to render the selecting gate 109 into a condition for passing the output of the adder circuit 110 and blocking the output of the A/D converter circuit 108. When the lever 16 is in the other position, the switch 16c is opened to render the gate 109 into a condition for passing the output of the A/D converter circuit 108 and blocking the output of the adder circuit 110. The output signal of the selecting gate 109 is sent to another selecting gate 111. Also connected to this selecting gate 111 is the output terminal of a start signal generating circuit 112 which generates the aforementioned start signal. The gate 111 selects one of the output of the selecting gate 109 and the output of the start signal generating circuit 112 in accordance with a signal $\phi_{101k}$ from the output terminal 101k of the control pulse generating circuit 101, and puts out the selected output to the storing unit through an output terminal CO. A detecting circuit 113 discriminates whether the signal input from the output terminal MO of the storing unit through an input terminal CI is the start signal, and sends a signal representing the result into the input terminal 101j of the control pulse generating circuit 101.

The content of an address counter 114 is sent through a 5-bit output terminal CA to the address setting circuit AS of the storing unit 2 and accesses the memory of a designated address. On the other hand, the output of the counter 114 drives the aforementioned display device 18 through a display circuit 117 and causes the display device to display the address of the memory being accessed. A switch 16a is operatively associated with the mode selecting lever 16 of FIG. 2 so that when the lever 16 is in the position of automatic access A, the switch 16a is connected to the terminal A of FIG. 9 and that when the lever 16 is in the position of manual access MAN or in the position MUL, the switch 16a is connected to the terminal M of FIG. 9. A manual address setting circuit 115 puts out a pulse and changes the contents of the address counter 114 one by one each time a push button switch 17a is closed when the switch 16a is in the position of terminal M. When the switch 16a is changed over to the position of terminal A, the address counter 114 is connected through the input terminal 114a thereof to the output terminal 101l of the control pulse generating circuit 101 and counts the clock pulses from the circuit 101. A switch 16b is operatively associated with the mode selecting lever 16 so that when the lever is in the position A, the switch 16b is opened and that when the lever is in the other position, the switch 16b is closed to inform the control pulse generating circuit 101 through an input terminal 101n as to whether the selected mode is automatic access. A one shot multi-vibrator 116 produces a single pulse $\phi_S$ when the switch 15a is closed by the release button 15 being depressed, and sends into the circuit 101 through an input terminal 101p a signal for starting the photographing sequence. An output terminal 101q sends the transfer pulse $\phi_{CT}$ for the storing unit to the input terminal MT of the storing unit 2 through an output terminal CT. An output terminal 101r sends a reset pulse to the input terminal MR of the storing unit 2 through an output terminal CR. An output terminal 101s puts out a signal $\phi_{busy}$ indicating whether the photographing sequence is going on. The signal $\phi_{busy}$ causes a sound generating member 119 to generate an alarm sound through a driving circuit 118, causes an alarm display device 121 such as LED to be turned on through a display circuit 120, and causes an electromagnet 123 to be operated through a driving circuit 122, thereby making the storing unit 2 inseparable from the image pickup unit 1 in the course of the photographing sequence with the aid of a safety device as shown in FIG. 10.

Figure 10:
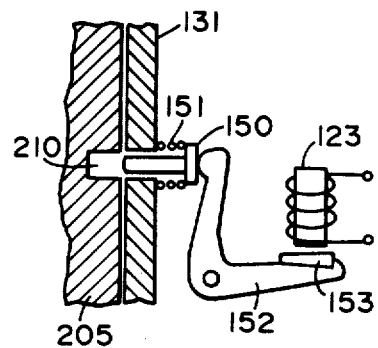
FIG. 10 is a cross-sectional view showing a safety device between the image pickup unit and the storing unit.

The safety device of FIG. 10 is provided between the image pickup unit 1 and the storing unit 2. The guide member 131 of the image pickup unit 1 shown in FIG. 3A is provided with a restraining pin 150 that can project therefrom. A return spring 151 biases the restraining pin 150 so as to be retracted inside the guide member 131. A lever 152 has secured to one end thereof an attracted piece 153 attracted to the electromagnet 123 and the other end of the lever 152 bears against the restraining pin 150. A restraining hole 210 is formed in the T-shaped groove 205 of the storing unit shown in FIG. 3B, and this restraining hole 210 becomes opposed to the restraining pin 150 when the storing unit 2 is mounted to the image pickup unit 1.

Turning back to the circuit system of FIG. 9, the switch 19 shown in FIG. 2 is connected between the output terminal 101s and the driving circuit 118 and generation of an alarm sound may be discontinued by opening this switch 19. An output terminal 101m is connected to the circuit 117 and 118 and it puts out an intermittent signal when all of the memories of the storing unit 2 have been used, to thereby cause the display device 18 to be turned on and off and cause the sound generating member 119 to generate an intermittent sound, thus indicating that there is no unused memory in the storing unit 2. The output of output terminal 101a is sent as a tuning signal to the flash device or the like through a contact 13 (see FIG. 2). A change-over switch 124 connected to an input terminal 101t is changed over in accordance with the amount of projection of the pin 207 (see FIG. 3B) studded in the upper surface of the storing unit 2, thereby transmitting the stored capacity of the storing unit 2 to the circuit 101. When the storing unit 2 is removed from the image pickup unit 1, a switch 124 is connected to the reset terminal 114r of counter 114 to reset the contects of this counter 114.

Figure 11:
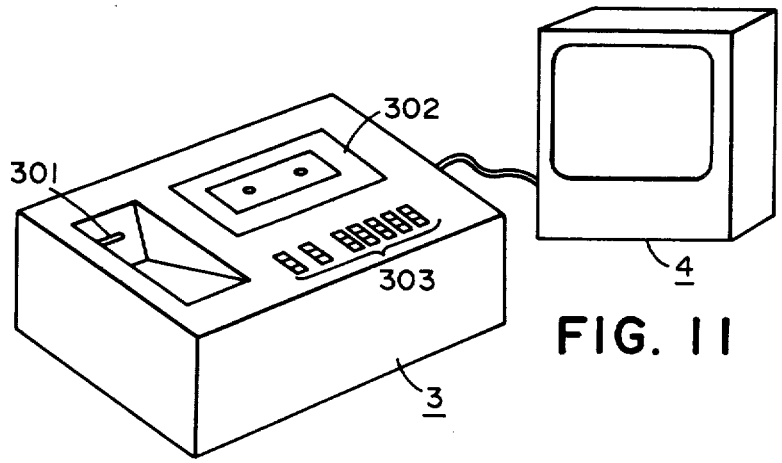
FIG. 11 is a perspective view showing the appearance of a converter and a monitor.

In FIG. 11, there are shown a converter 3 for transferring the image signals stored in the storing unit 2 to a magnetic tape cassette and a monitor 4 for transforming the image signals into images. The converter 3 is provided with a connector 301 connected to the connector 206 of the storing unit 2, a cassette holder 302 into which may be loaded a magnetic tape cassette, and an operating button 303.

Operation of the present embodiment will now be described. The storing unit 2 is mounted to the image pickup unit 1 in the manner as shown in FIGS. 1 and 2. Thereby, the connector 206 of the storing unit 2 is connected to the connector (not shown) of the image pickup unit 1, and terminals MA, MO, MI, MT and MR shown in FIG. 7 are connected to the terminals CA, CI, CO, CT and CR, respectively, of FIG. 9. Assume that the mode selecting lever 16 of the image pickup unit 1 has been brought to the position of automatic access A and that the switch 19 has been closed. Thereupon, the switch 16a in FIG. 9 is connected to terminal A, and switches 16b, 16c and 16d become open. In this condition, and phototaking lens 10 is turned to an object, the composition is determined and the focus is adjusted. When the release button 15 is depressed deeply, the switch 15a of FIG. 9 becomes closed and from the one shot multi-vibrator 116, a single pulse $\phi_S$ as shown in the time chart of FIG. 12A is emitted to the input terminal 101p of the control pulse generating circuit 101. The circuit 101 having received it generates a pulse $\phi_A$ from the output terminal 101l thereof at the timing as shown in FIG. 12B. This pulse $\phi_A$ provides the input of an address counter 114 through the switch 16a. The counter 114 has been reset when the storing unit 2 was removed from the image pickup unit 1. Accordingly, the contents of the counter progress one by one from 1 each time a pulse $\phi_A$ comes in. Thereby, the counter 114 accesses the memories in the storing unit 2 successively through terminals CA and MA. That is, when the counter 114 counts the first pulse from the terminal 101l, it accesses the first memory MC1 and, when the counter 114 counts the second pulse, it accesses the second memory MC2 and thereafter, in a like manner, the counter 114 accesses up to the last memory MC20 each time it counts the pulse. The detecting circuit 113 receives via terminals NO and CI the output signal of the memory accessed by the counter 114 and, when this is the start signal, the detecting circuit sends a signal $\phi_{113}$ of L-level to an input terminal 101j and, when this is not the start signal, the detecting circuit sends a signal $\phi_{113}$ of H-level to the input terminal 101j. Usually, with a newly mounted storing unit 2, it is almost the case that all the memories therein are unused and therefore, the signal $\phi_{113}$ accesses the first memory MC1 and immediately assumes H-level. Accordingly, the first memory MC1 is accessed for photography and the address of the first memory, i.e. "1", appears at the display device. However, if some memories, for example, the first to third memories MC1–MC3, are used memories, then the circuit 101 continues to send pulse $\phi_A$ to the counter 114 as long as the output $\phi_{113}$ of the detecting circuit 113 is at L-level. In this manner, the addresses are progressed one by one and when an unused memory, here the fourth memory MC4, is reached, the output $\phi_{113}$ assumes H-level at the timing as shown in FIG. 12C and the outputting of the pulse $\phi_A$ is discontinued. The memory at that time is accessed for photography and the address of that memory is displayed on the display device 18. The above-described process is called the address search.

The circuit 101 detects that all of the memories in the storing unit 2 are used memories when the output of the circuit 113 does not assume H-level even if the address pulse $\phi_A$ is generated by the number of frames transmitted by the pin 207 and the change-over switch 124. Thereupon, the circuit 101 produces an intermittent signal from the terminal 101m thereof to turn on and off the display device 18 and cause the sound generating member 119 to produce an intermittent sound and discontinue the photographing sequence. From this, the photographer knows that there is no unused memory. Such a series of warning operations are also effected when the release button has been depressed without the storing unit 2 being mounted to the image pickup unit 1. This is due to the circuit 101 detecting the unmounted condition of the storing unit 2 with the aid of the opening of switch 124. This warning by the unmounting is particularly effective in cameras of a construction in which the storing unit is loaded into the interior of the image pickup unit to prevent the presence of the storing unit from being visually confirmed from outside.

When an unused memory is accessed, the output $\phi_{113}$ of the circuit 113 assumes H-level and the pulse $\phi_A$ is stopped. As shown in FIG. 12E, the output $\phi_{TG2}$ of terminal 101d assumes H-level with the initiation of power supply by depressing the release button 15 shallowly, and renders open the transfer gates $TG_{2.1}$–$TG_{2.n}$ of the image pickup device 11 shown in FIG. 5. Accordingly, the charge produced in accordance with the intensity of light applied to the light-receiving elements $a_{1.1}, \ldots, a_{m.n}$ is not accumulated in each element but is always taken out as photocurrent through overflow drain $OD_1$–$OD_n$ and output terminal 11a and subjected to processes such as amplification, logarithmic conversion, AD conversion, etc. by the metering circuit 102, and then applied to the memory operating circuit 103. When the unused memory in the storing unit 2 has been accessed, the output $\phi_{101C}$ of terminal 101C changes from L-level to H-level at the timing as shown in FIG. 12D in accordance with the output $\phi_{113}$ of the circuit 113. When this output $\phi_{101C}$ has changed to H-level, the output of the metering circuit 102 is stored in the circuit 103. In the circuit 103, such an aperture value and charge accumulation time, i.e., exposure time, that a proper exposure (amount of charge accumulation) is obtained from the stored intensity of light are calculated. The information of the proper aperture value is sent to the diaphragm control circuit 105 to control the diaphragm 10a in a conventional manner. Also, the two types of information, namely, the proper aperture value and the proper charge accumulation time, are sent to the display circuit 106 and the display within the finder is effected by the display element 107. Further, the information of the proper charge accumulation is also sent to the time counting circuit 104. Immediately after that, the output $\phi_{TG2}$ of terminal 101d changes from H-level to L-level at the timing as shown in FIG. 12E and the transfer gates $TG_{2.1}$–$TG_{2.n}$ are closed. Simultaneously therewith, the accumulation of charge corresponding to the exposure amount is initiated in the light-receiving elements $a_{1,1}, \ldots, a_{m,n}$ of the image pickup device while, at the same time, a signal $\phi_{101a}$ (see FIG. 12E) similar to signal $\phi_{TG2}$ appears at terminal 101a. The time counting circuit 104 receives the signal $\phi_{101a}$ and causes the output $\phi_{104}$ thereof to change from L-level to H-level as shown in FIG. 12F, thus starting the time counting. When said proper charge accumulation time elapses, the output $\phi_{104}$ changes from H-level to L-level. The circuit 101 having received this through terminal 101b puts out a pulse $\phi_{TG1}$ as shown in FIG. 12G from the output terminal 101e thereof and opens the transfer gates $TG_{1,1}-TG_{1,n}$ of the image pickup device 11 for a moment. Thereby, the charges accumulated in the light-receiving elements $a_{1,1}, \ldots, a_{m,n}$ shift to longitudinal shift registers $S_{v1}-S_{vn}$. This completes the exposure. The charge accumulation time, namely, the exposure time is the time from the closing of the transfer gates $TG_{2,1}-TG_{2,n}$ by the change of the output $\phi_{TG2}$ from H-level to L-level till the opening of the transfer gates $TG_{1,1}-TG_{1,n}$ by the outputting of the pulse $\phi_{TG1}$.

When the exposure is thus terminated, a signal $\phi_{101k}$ is produced from terminal 101k to the selecting gate 111 at the timing as shown in FIG. 12H. Since the output from the terminal 101k is at H-level, the gate 111 selects the output (start signal) from the start signal generating circuit 112 and transmits it to output terminal CO. In synchronism therewith, a transfer pulse $\phi_{CT}$ as shown in FIG. 12M is sent from terminal 101q to the storing unit 2 through terminals CT and MT, and start signal is sent through an input terminal MI into the memory being accessed. Subsequently, longitudinal transfer pulses $\phi_{v1}$ and $\phi_{v2}$ are respectively sent from output terminals 101f and 101g to the input terminals 11d and 11e of the image pickup device 11 of FIG. 5 at the timings as shown in FIGS. 12I and 12J, and lateral transfer pulses $\phi_{h1}$ and $\phi_{h2}$ are respectively sent from output terminals 101h and 101i to input terminals 11f and 11g at the timings as shown in FIGS. 12K and 12L. Thereby, the image signal of each light-receiving element is put out from output terminal 11h in a time-series fashion. This signal is converted into a digital signal by the A/D converter circuit 108 and applied to the selecting gate 109. The gate 109 passes therethrough the image signal from the circuit 108 since the switch 16C is in its OFF position. The selecting gate 111 also passes therethrough the image signal from the gate 109 since the output from terminal 101k assumes L-level, and the image signal is applied from output terminal CO to the input terminal MI of the storing unit 2. Further, by the transfer pulse $\phi_{CT}$ generated in synchronism with the aforementioned transfer pulses $\phi_{v1}$, $\phi_{v2}$, $\phi_{h1}$ and $\phi_{h2}$, the image signals are successively transferred into the shift registers of the memory being accessed after the start signal. When image signals corresponding to one frame have been transferred, start signal appears at the output terminal MO of the storing unit 2 and therefore, this is applied to the detecting circuit 113 through the input terminal CI of the image pickup unit 1. The circuit 113 detects this and stops the aforementioned transfer pulses $\phi_{v1}$, $\phi_{v2}$, $\phi_{h1}$, $\phi_{h2}$ and $\phi_{CT}$. This completes the photographing sequence for one frame. Thereafter, each time the release button 15 is depressed deeply, the above-described photographing sequence may be repeated until there is no unused memory.

In the course of the above-described photographing sequence, namely, during the time from depression of the release button 15 till completion of the address search, exposure and transfer, the signal $\phi_{busy}$ shown in FIG. 12N is produced from output terminal 101S. The signal $\phi_{busy}$ drives the sound generating member 119 and display device 121 to make the warning that the photographing sequence is going on and also to energize the electromagnet 123. The electromagnet 123, when energized, attracts the attracted piece 153 shown in FIG. 10, so that the lever 152 pivots counter-clockwisely to cause the restraining pin 150 to project against the force of spring 151 and come into the restraining hole 210. Accordingly, during the time from depression of the release button 15 till completion of the transfer of the corresponding image signal to the storing unit, because of the engagement between the restraining pin 150 and the restraining hole 210, the storing unit 2 cannot be separated from the image pickup unit 1 even if the mounting-dismounting slider 203 is operated. Of course, when the memory operation is completed, the signal $\phi_{busy}$ disappears and therefore, the electromagnet 123 is deenergized to permit the restraining pin 150 to be returned to its shown position by the force of the spring 151 and permit removal of the storing unit.

Description will now be made of a case where the manual access (MAN) is selected by the mode selecting lever 16. In this case, the memory of a desired address can be manually accessed. When the lever 16 shown in FIG. 2 is brought to the position MAN, the switch 16a of FIG. 9 is connected to terminal M and the switch 16b is closed while the switches 16c and 16d remain open. When the push button 17 is pushed in this condition, a normally open switch 17a is closed and each time the push button is pushed, a pulse is generated from the manual address setting circuit 115, whereby the contents of the address counter 114 progress one by one from the address of the memory to which an image signal has been transferred immediately before. Accordingly, the memory of the desired address may be determined by seeing the display device 201 and the push button 17 may be operated until the desired address appears as on the display device 18. Of course, where a memory used immediately before is desired, the push button 17 need not be pushed. When the release button 15 is depressed after completion of this manual access, the process of the aforementioned address search does not take place but instead, a reset pulse is put out from terminal 101r to the memory through terminals CR and MR and resets the four bits of the start signal appearing at the output of the memory where the accessed memory is a used one. Accordingly, irrespective of whether the accessed memory is a used one or an unused one, the output of the detecting circuit 113 assumes H-level and thus, the accessed memory becomes usable. The sequence thereafter is smaller to that when the lever 16 is in the position A, and the start signal and image signal are transferred to the accessed memory. Thus, according to the manual access mode, even when the photographer has failed in photographing, if the lever 16 is only adjusted to MAN and the release button 15 is only depressed deeply again, the failure image signal transferred into the memory will be replaced by a newly photographed image signal and therefore, the memory can be used wastelessly. Also, if the push button 17 is operated, desired memories such as, for example, MC1, MC3, MC5, . . . can be used. The manual access is effected cyclically. That is, when the push button 17 is pushed after the memory of the last address (MC20) has been accessed, the first memory (MC1) is accessed. This is due to the fact that the counter 114 is a programmable counter and the memory capacity of the storing unit 2 by the switch 124 and pin 207 is digitalizedly input to the unshown program input terminal thereof so that the contents of the counter are reset when the total number of memories is counted.

Description will now be made of a case where the multi-exposure mode is selected by the lever 16. First, the lever 16 is brought to the position MUL after the photographing sequence has been terminated in one of the aforementiond two modes. Thereupon, the switch 16a is connected to terminal M and the switches 16b, 16c and 16d are all closed. Thereafter, even if the release button 15 is depressed, the process of the address search does not take place as in the case of the aforedescribed manual access mode and the memory to which an image signal has been transferred immediately before remains accessed. Thus, as in the case of the manual access mode, reset pulse is put out from terminal 101r to reset the start signal of the memory which remains accessed.

Next, the process shifts to the transfer process via the aforementioned charge accumulation (exposure) process. Since the switch 16c is now in its ON position, the selecting gate 109 selects the output of the adder circuit 110 which has been rendered operative by closing of the switch 16d and makes it possible for such output to pass therethrough. As described hitherto, when the start signal is transferred to the accessed memory, the adder circuit 110 puts out a signal representing the arithmetical mean of the image signal from the accessed memory which is input from terminal CI and the image signal from the A/D converter circuit 108 which has just been photographed. Of course, this is effected under complete synchronism between the transfer pulses. This arithmetical mean signal is transferred to the accessed memory via the gates 109, 111 and terminals CO, MI. When the transfer of one frame is thus terminated, an image signal in which a first object to be photographed and a second object to be photographed have been combined together is stored in the accessed memory. This may be repeated as often as desired to accomplish multi-exposure and each time, the arithmetical mean instead of the sum is taken and thus, there is no fear of over-exposure. It is also possible to combine such image signal with the image signal of the previously used memory by accessing not only the memory used immediately before but also the memory of the desired address by the push button 17.

The storing unit 2 having been photographed in any of the above-described modes and having no longer any unused memory may be removed from the image pickup unit 1 by operating and pulling down the mounting-dismounting slider 203. Then, the image signals stored in the storing unit 2 may be transferred to a magnetic tape cassette by the converter 3. For this purpose, the connector 206 of the storing unit 2 is connected to a connector 301, a tape cassette is loaded into a cassette holder 302 and an operating button 303 is operated. By doing so, the image signals in the memories of the storing unit 2 are successively transferred to the magnetic tape while, at the same time, the transferred memories are reset and become ready for reuse. Also, in this case, the converter 3 charges a secondary battery contained in the storing unit 2 for the back-up of the memories and the driving of the display device 201.

Figure 13:
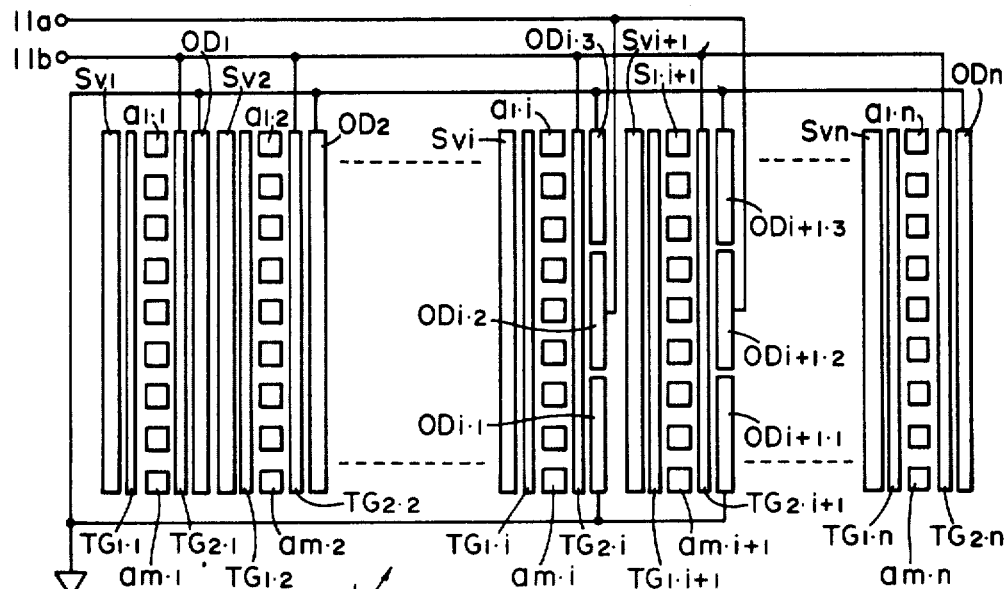
FIG. 13 is a schematic view showing the construction of a solid state imaging sensing device according to another embodiment of the present invention.

FIG. 13 shows an image pickup device 11' according to another embodiment of the present invention. In most points, the construction of the image pickup device 11' is similar to that of the image pickup device 11 shown in FIG. 5 and therefore, the lateral shift register $S_h$, the sense amplifier A and part of the wiring are not shown. The difference between the FIG. 13 device and the FIG. 5 device lies in that the overflow drain near the center of the image pickup device is divided into three as indicated by $OD_{i,1}$, $OD_{i,2}$, $OD_{i,3}$, $OD_{i+1,1}$, $OD_{i+1,2}$, $OD_{i+1,3}$. Among these, only the overflow drains $OD_{1,2}$, $OD_{i+1,2}$, . . . are connected to output terminal 11a and put out a metering output to the metering circuit 102. The other overflow drains $OD_1$, $OD_2$, . . . , $OD_{i,1}$, $OD_{i,3}$, $OD_{i+1,1}$, $OD_{i+1,3}$, . . . , $OD_n$ are all connected to the substrate of the image pickup device. By doing so, when the transfer gates $TG_{2,1}$, $TG_{2,2}$, . . . , $TG_{2,i}$, $TG_{2,i+1}$, . . . , $TG_{2,n}$ are open, only the outputs of the light-receiving elements corresponding to the overflow drains connected to the aforementioned output terminal 11a are sent to the metering circuit 102 for use for exposure control. Thus, partial metering which meters only the central portion of the picture plane is achieved.

By weighting the metering outputs of the overflow drains surrounding the central overflow drain and inputting such outputs to the metering circuit 102 instead of connecting these surrounding overflow drains to the substrate, the picture place central portion priority metering becomes possible. By so designing the division, connection and weighting of the overflow drain, any type of metering becomes possible.

Figure 14:
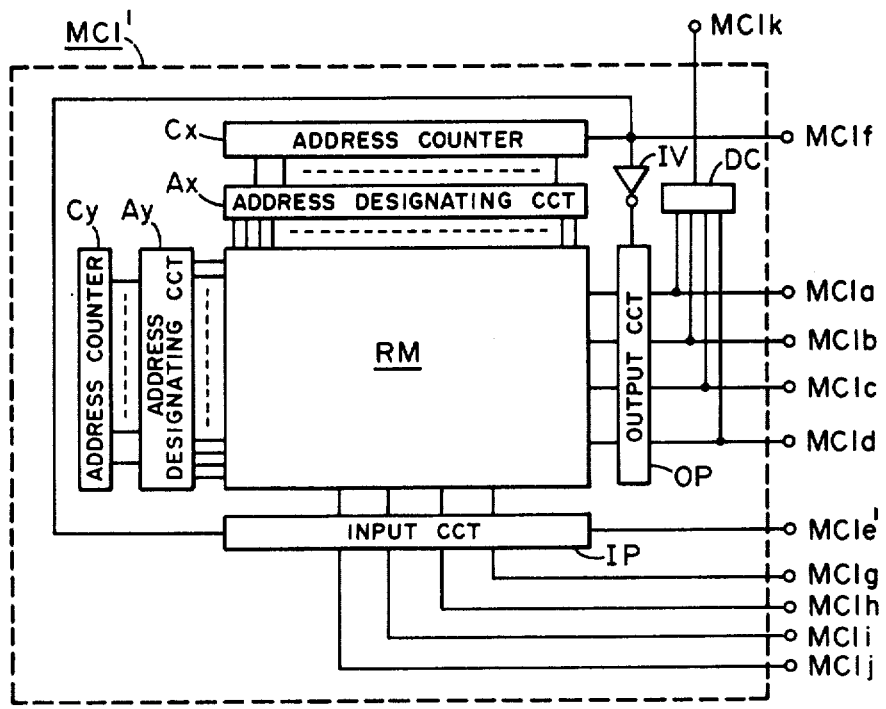
FIG. 14 is a circuit diagram of a memory according to another embodiment of the present invention.

FIG. 14 shows a memory according to another embodiment of the present invention. In the memory MC1 shown in FIG. 6, shift registers SR1, SR2, SR3 and SR4 are used for the memory device, but here a random access memory is used. In FIG. 14, elements given reference characters similar to those in FIG. 6 are functionally similar to the elements in FIG. 6. In the memory matrix RM of the random access memory, if one image element is to be expressed by 4 bits, there are prepared memory cells of a bit number equal to 4×total number of image elements (m×n), plus 1. Each 4 bits form one set (one word), and one word of the address designated by an x-direction address designating circuit Ax and a y-direction address designating circuit Ay is accessed to input terminals MC1g–MC1j similar to those of FIG. 6 through an input circuit IP and also accessed to output terminals MC1a–MC1d similar to those of FIG. 6 through an output circuit OP. The addresses of Ax and Ay are provided by an x-direction address counter Cx and a y-direction address counter Cy, respectively. That is, these counters are series-connected and count the clock pulses input from terminal MC1f to the counter Cx. These counters start from x=0 and y=0 and when each memory cell group in the column of y=0 has been accessed, x returns to 0 and y=1 is brought about by place-up, whereupon the counters begin to access the memory cell group of this column. These counters are designed to return to x=0 and y=0 when they have accessed all the memory cell groups in the memory matrix RM.

H-level input is sent to the output circuit OP by an inverter IV before clock pulses are input thereto and therefore, the output circuit OP is open. At that time, the content of the memory cell group of the address being accessed (x=0, y=0) is being sent to the detecting circuit 113 of the image pickup unit 1 through output terminals MC1a–MC1d. If this is not the start signal, the detecting circuit 113 reports to the control pulse generating circuit 101 that memory MC1' is usable.

In synchronism with the clock pulses, start signals and image signals are successively sent to input terminals MC1g–MC1j, but when the clock pulses assume H-level, the input circuit IP is opened. At the same time, start signal is input therethrough and stored in the memory cell group of the address (x=0, y=0) being accessed from before the pulses are input. Subsequently, when the H-level pulse falls, the counter Cx counts up and the memory cell group of the next address (x=1, y=0) is accessed. When the pulse assumes L-level, the output circuit OP is opened. Subsequently, when the pulse assumes H-level, the input circuit IP is opened and the first image signal is input and stored in the accessed address (x=1, y=0).

The above-described operation is repeated, whereby the last image signal is stored in the memory cell group of the last address (x=m, y=n) and the pulse falls, whereupon the memory cell group of the first address (x=0, y=0) is again accessed. When the clock pulses assume L-level, the output circuit OP is opened and the start signal stored therein is put out to the detecting circuit 113 through MC1a–MC1d. The circuit 113, having received this, stops the transfer to input terminal MC1f of the clock pulses generated by the control pulse generating circuit 101. This completes the transfer of image signal to the memory MC1', which thus becomes a used one.

A reset terminal MC1e' is provided to reset the start signal by sending a reset signal to this terminal when the start signal is being accessed.

Compactness of the apparatus can be realized by making small the memory capacity of the storing unit which requires a relatively large space. For the reduction of the scale of the memory capacity, it is desirable to use a converter as shown in FIG. 11 to transfer the stored content to another memory device having a great capacity and thereby make the storing unit reusable. For the reason that such transfer can be effected more effectively, it is preferred that the memories of the storing unit be constructed like the embodiment of FIG. 14.

On the other hand, to drive the image pickup unit and the storing unit, power supply batteries for supplying power to these must be contained therein. Consumption of power supply batteries may result in failure of photography. The embodiment shown below is an electronic camera which uses chargeable power supply batteries and which is provided with an energy supply system for charging the power supply batteries during the transfer of the stored content by the aforementioned converter.

The power supply system of an electronic camera system comprising an image pickup unit, a storing unit and a converter will hereinafter be described in detail.

In FIG. 15A, a power supply battery E1 such as a manganese dry battery contained in the image pickup unit 1 is shown in a broken away view, and in FIG. 15B, a chargeable type power supply battery E2 such as a silver oxide secondary battery contained in the storing unit 2 is shown in a broken away view. With the image pickup unit 1 and the storing unit 2 being separated from each other, the image pickup unit 1 and the storing unit 2 are supplied with power from the batteries E1 and E2, respectively, but with the storing unit 2 being mounted to the image pickup unit 1, the storing unit 2 is supplied with power from the battery E1. By this, consumption of the battery E2 having a small electric capacity can be minimized. The power supply circuit system therefor is shown in FIG. 16. With the storing unit 2 being mounted to the image pickup unit 1, the back-up terminals CB and MB of the image pickup unit 1 and the storing unit 2 are connected together. Therefore, the battery E1 supplies power to the circuit system 1a (see FIG. 8) of the image pickup unit 1 and also supplied power to the memory circuit system 2a (see FIG. 6) comprising memories MC and circuits therearound through the back-up terminals CB and MB. At this time, a P channel enhancement MOSFETQ1 is OFF because there is a high level voltage applied to the gate thereof, and thus the power supply path from the battey E2 to the circuit system 2a is cut off.

If, at this time, the battery E1 is consumed and the voltage thereacross is not sufficient to hold the stored contents of the memories MC, the gate voltage of FETQ1 does not become high and therefore, FETQ1 becomes ON and the power supply from the battery E2 to the memory circuit system 2a is effected. A diode D1 is provided to prevent the current from the battery E2 from flowing into the image pickup unit 1 when the voltage of the battery E1 is low, and a capacitor C1 serves to absorb any voltage fluctuation of the battery E1 resulting from any load fluctuation and also to hold the power supply voltage so that the contents of the memories MC do not volatilize even if the power supply to the memory circuit system 2a is cut off for a very short time by accident.

When the storing unit 2 is removed from the image pickup unit 1, the terminals CB and MB become disconnected from each other. Accordingly, FETQ1 becomes ON due to the drop of the gate voltage and the battery E2, in place of the battery E1, supplies power to the circuit system 2a.

A voltage detecting circuit VD always detects the voltage of the battery E2 and when this voltage drops to a first level, the voltage detecting circuit VD sends an intermittent signal to a display circuit DP shown in FIG. 7 to cause a display device 201 to be turned on and off. This warns that the voltage of the battery E2 has begun to drop. Also, when the voltage of the battery E2 further drops to a second level, the circuit VD sends an operating signal to a sound generating device SD to cause it to generate an alarm sound. This warns that the voltage of the battery E2 has approached a lower limit voltage necessary to hold the contents of the memory cells MC. Further, the voltage detecting circuit VD puts out a charging completion signal to a voltage detecting terminal MV only when the voltage of the battery E2 is sufficient. A charging terminal MC for charging the battery E2 is connected to the opposite ends of the battery E2.

Figure 17:
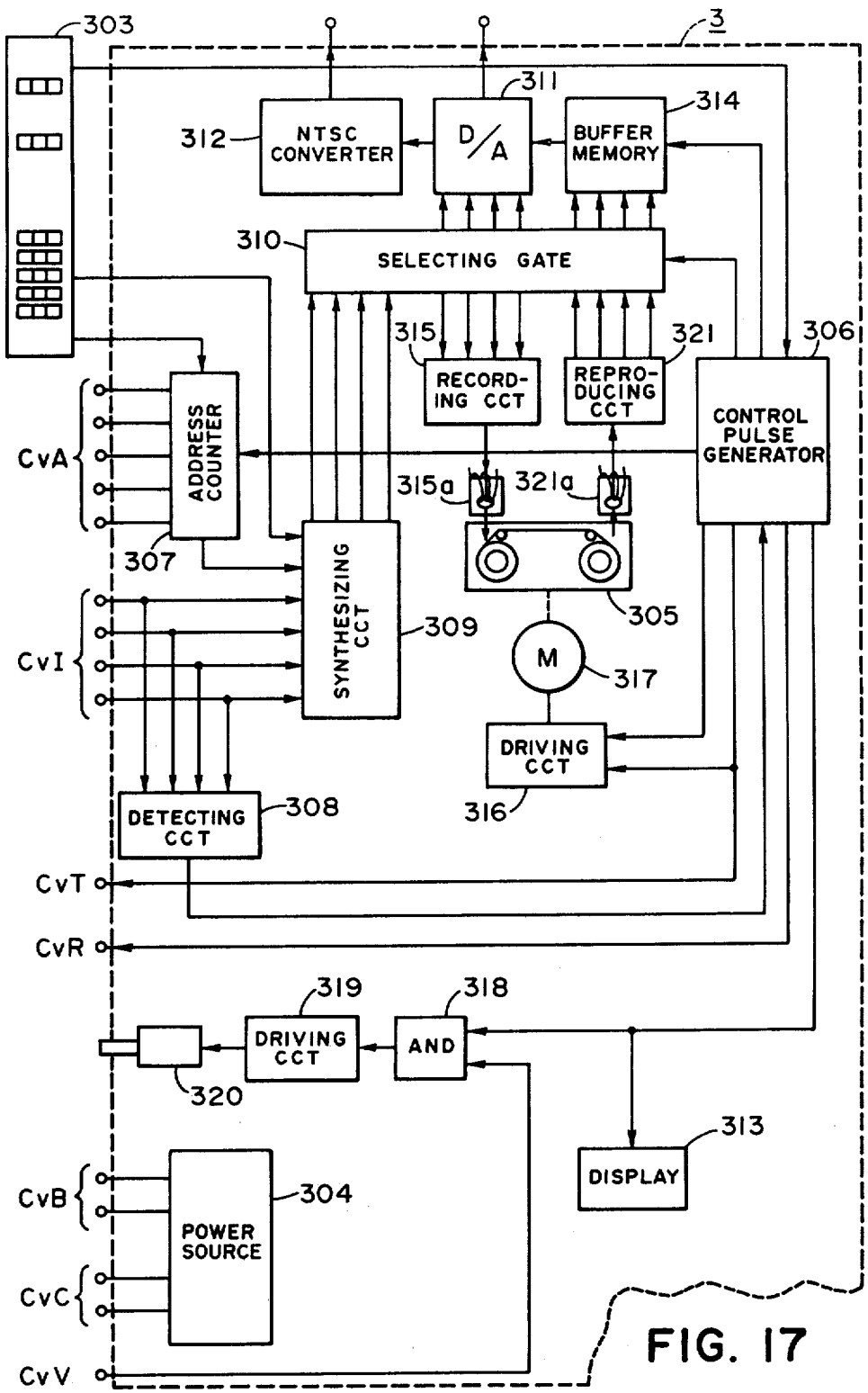
FIG. 17 is a circuit diagram of the converter.

FIG. 17 shows the circuit system of the converter 3. When the storing unit 2 is removed from the image pickup unit 1 for the image signal transfer and the connector 206 of the storing unit 2 is connected to the connector 301 of the converter 3, the terminals MA, MO, MT, MR, MB, MC and MV of the storing unit 2 shown in FIGS. 7 and 16 are connected to the terminals CvA, CvI, CvT, CvR, CvB, CvC and CvV, respectively, of the converter 3. When these connections are completed, charging current is automatically supplied from the power source 304 of the converter 3 to the battery E2 through the terminals CvC and MC, whereby charging is started. Along therewith, the power source 304 effects back-up of the circuit system 2a through the terminals CvB and MB. Accordingly, at this time, FETQ1 becomes OFF and prevents the charging current from the terminal MC from flowing into the circuit system 2a.

FIG. 18 shows the internal structure of this power source 304. An AC input AC is reduced in voltage by a transformer TR and rectified by full wave rectifiers BR1, BR2 and BR3. The output of the rectifier BR1 is smoothed by a capacitor C2 and supplied to each circuit of the converter 3. The output of the rectifier BR2 is smoothed by a capacitor C3 and sent to the back-up terminal CvB, and the output of the rectifier BR3 is sent to the charging terminal CvC via a current limiting resistor R.

A secondary battery of a great capacity may be contained in the storing unit 2 so that power supply to the circuit system 1a may also be effected by such battery. In this case, the power supply circuit system when the storing unit 2 has been mounted to the image pickup unit 1 assumes a condition in which the battery E1 in FIG. 16 is removed and terminal CB is connected to the terminal MC of the storing unit 2. Also, in that case, FETQ1, two resistors connected to the gate thereof and diode D1 are eliminated because they are unnecessary, and lines connected to the source drain of FETQ1 and the anode and cathode of the diode D1 are short-circuited.

Turning back to FIG. 17, the operation of the converter 3 for transferring image signals from the storing unit 2 to a magnetic tape 305 will be described in detail. For the transfer, three modes of operation, namely, search mode, automatic transfer mode and manual transfer mode are suitably selected in the converter 3. The search mode is a mode for selecting image signals stored in the memories of the storing unit 2 prior to the transfer of images, the automatic transfer mode is a mode for successively automatically transferring to the tape the image signals selected in the search mode, and the manual transfer mode is a mode for transferring in an arbitrary order the image signals selected in the search mode.

Operation of the search mode will first be described. The magnetic tape 305 is loaded into the cassette holder 302 (FIG. 11) of the converter 3, and then the search mode key of the keyboard 303 is depressed. Thereupon, a signal is generated from the keyboard 303 to the control pulse generating circuit 306 to report to the circuit 306 that the search mode has been selected. In response thereto, the circuit 306 sends a pulse to the address counter 307. Each time a pulse comes into the address counter, the contents of the counter progress one by one from 1. By this, the counter 307 accesses the memories in the storing unit 2 successively through the terminals CvA and MA. That is, when the counter 307 counts the first pulse from the circuit 306, it accesses the first memory MC1 and, when the counter 307 counts the second pulse, it accesses the second memory MC2, and thereafter, in a like manner, it accesses up to the last memory MC20 each time it counts the pulse. The start signal detecting circuit 308 receives through terminals ML and CvI the output signal of the memory accessed by the counter 307 and, when this output signal is the start signal, the circuit 308 sends an H-level signal to the circuit 306 and, when said output signal is not the start signal, the circuit 308 sends a L-level signal to the circuit 306. Usually, with a newly mounted storing unit 2, it is almost the case that all of the memories therein are used ones and therefore, the signal of the detection circuit 308 assumes H-level immediately after it has accessed the first memory MC1. Accordingly, the first memory MC1 is accessed.

The control pulse generating circuit 306 sends a transfer pulse to the accessed memory MC1 of the storing unit 2 through terminals CvT and MT. Accordingly, the image signal stored in the memory MC1 is read out. At this time, the transfer pulse is repetitively sent at a period of one frame per 1/30 sec. and therefore, the image signal is continuously sent to a signal synthesizing circuit 309 through terminals MO and CvI. With the image signal, an index indicative of the address of the memory being accessed is input to the circuit 309 from the address counter 307. The circuit 309 synthesizes the image signal and the index signal and sends the synthesized signal to the selecting gate 310. At this time, the gate 310 is set by the control signal from the pulse generating circuit 306 so as to send out the input from the signal synthesizing circuit 309 to a D/A converter circuit 311. Accordingly, the synthesized signal sent out from the circuit 309 is sent through the D/A converter circuit 311 to NTSC (National Television System Committee) converter circuit 312. This circuit 312 converts the synthesized signal into NTSC system and sends it through an output terminal to the monitor 4 shown in FIG. 11. In the monitor 4, the image signal stored in the memory MC1 is made into an image and the address of the memory MC1, namely, "1", is inserted into and displayed on that image.

If it is intended to transfer this image, the transfer key of the keyboard 303 may be depressed and, if it is not intended to transfer this image, the reset key may be depressed. When the transfer key is depressed, a signal reporting to that effect is sent from the keyboard 303 to the control pulse generating circuit 306. In response thereto, the circuit 306 sends a pulse to the address counter 307 to cause this counter to access the next used memory and cause the image signal stored in that memory and the address of that memory to be made into an image in the monitor 4 in the same manner as the above-described operation. When the reset key has been depressed, a signal reporting to that effect is sent from the keyboard 303 to the control pulse generating circuit 306. In response thereto, the circuit 306 sends a reset pulse to the memory MC1 through terminals CvR and MR, thus resetting the start signal stored in the memory MC1. Then, it sends a pulse to the address counter 307 and accesses the next used memory and makes it into a image in the monitor 4.

When the above-described operation is carried out over all of the used memories, a signal indicative of the completion of the search work is sent from the circuit 306 to the display device 313 to cause the latter to display to that effect. Although not shown, the information of the memory capacity of the storing unit 2, i.e. the total number of memories, necessary for the judgment is obtained by detecting the amount of projection of the pin 207 studded in the storing unit 2 by means similar to the switch 124 shown in FIG. 9 and transmitting it to the circuit 306.

Description will now be made of the operation of the converter 3 when the automatic transfer mode has been selected. When the automatic transfer mode key of the keyboard 303 is depressed, a signal is sent from the keyboard 303 to the control pulse generating circuit 306 to report that this mode has been selected. In response thereto, the circuit 306 sends a pulse to the address counter 307 to cause this counter to access the first memory, for example, MC1, in which the start signal is not reset, and also sends a transfer pulse to the memory MC1 through terminals CvT and MT to cause the image signal stored in the memory MC1 to be sent to the signal synthesizing circuit 309. This circuit 309 synthesizes the index signal from the address counter 307 and the image signal and sends the synthesized signal to the selecting gate 310. At this time, the gate 310 is set by the control signal from the control pulse generating circuit 306 so as to send its output to a buffer memory 314. Accordingly, the synthesized signal from the synthesizing circuit 309 is sent to the buffer memory 314. A write-in control signal from the control pulse generating circuit 306 is sent to the memory 314, so that the synthesized signal is written thereinto. This write-in control signal is generated in synchronism with the transfer pulse to the storing unit 2. When this write-in is completed, the control pulse generating circuit 306 repetitively sends a read-out control signal to the buffer memory 314 at a period of one frame per 1/30 sec. Thereby, the synthesized signal stored in the buffer memory 314 is sent to the monitor 4 via the D/A converter circuit 311 and NTSC converter circuit 312. An image comprising the image signal of the memory MC1 with "1" inserted thereinto appears at the monitor 4.

At the point of time whereat the writing of the synthesized signal into the buffer memory has been completed, the circuit 306 sends a control signal to the gate 310 to change over this gate so that the output of the synthesizing circuit 309 is set to a recording circuit 315 and also to stop the delivery of the transfer pulse to the memory MC1. The recording circuit 315 applies frequency modulation, amplification, etc. to a digital input signal and sends such signal to a recording multi-head 315a. Simultaneously therewith, the pulse generating circuit 306 sends a starting signal to a motor driving circuit 316 to thereby start a motor 317. When the revolution of the motor 317 becomes a steady state, the revolution of the motor is transmitted to the tape, which thus begins to rotate. At the same time, a transfer pulse having a relatively long period is sent from the pulse generating circuit 306 to the motor driving circuit 316 and the terminal CvT. Accordingly, the image signal of the memory MC1 is read out at a relatively slow speed and is recorded on the tape 305 via the signal synthesizing circuit 309, the selecting gate 310, the recording circuit 315 and the recording multi-head 315a (this head has four channels, but only one channel is shown for simplicity). At this time, the tape is speed-controlled by the transfer pulse. At this time, the index signal is not generated from the address counter 307 to the synthesizing circuit 309 and therefore, this signal is not recorded on the tape. When the transfer of the image signal to the tape 305 is completed, a reset pulse is sent to the memory MC1 through terminals CvR and MR to reset the start signal. At the same time, a stop signal is sent to the motor driving circuit 316 to stop the motor.

Subsequently, the pulse generating circuit 306 sends a control signal to the selecting gate 310 to change over this gate so as to send the output of the signal synthesizing circuit 309 to the buffer memory 314. Then, it sends a pulse to the address counter 307, which accesses the next used memory and causes the image signal stored therein to be made into an image in the monitor 4 through the buffer memory by an operation similar to that described above and also causes the motor 317 to revolve to thereby record the image on the tape.

The above-described operation is repeated and, when the image signals of all of the used memories are transferred to the tape 305 and the start signal therefor is reset and becomes reusable, the pulse generating circuit 306 operates the display device 313 to cause it to display that the transfer has been completed. If, at this time, the charging of the power supply battery E2 of the storing unit 2 has also been completed, the storing unit 2 is automatically separated from the converter 3. This is accomplished by providing an AND circuit 318 for receiving at one input the charging completion signal from the voltage detecting circuit VD of the storing unit 2 through terminals MV and CvV and for receiving said transfer completion signal at the other input, and by sending the output of the AND circuit to a solenoid driving circuit 319 to operate a solenoid 320 and press the storing unit 2 in its separable direction by the plunger of the solenoid.

Completion of the writing into the buffer memory 314 and tape 305 of image signals corresponding to one frame is detected by the start signal of the accessed memory being again input to the detecting circuit 308.

Description will now be made of the operation when the manual transfer mode has been selected. When the manual transfer mode key of the keyboard 303 is depressed, a signal is sent from the keyboard 303 to the pulse generating circuit 306 to report that the manual transfer mode has been selected. Here, the address of a desired used memory is depressed by the ten-key of the keyboard 303. Thereupon, a signal corresponding to that address is sent to the counter 307, which thus accesses the memory of that address. As in the case of the automatic transfer mode, the image signal of the accessed memory is displayed on the monitor 4 with that address number through the buffer memory 314, and the image signal is recorded on the tape 305. When the transfer to the tape is completed, a reset pulse is sent to the memory through terminals CvR and MR, whereby the start signal is reset. The display on the monitor 4 and the rotation of the tape are stopped.

The address of another used memory is accessed by depressing the ten-key of the keyboard 303 to cause an operation similar to that described above to be effected.

The above-described operation is effected over all of the used memories and, when the image signals stored in them are transferred to the tape and the start signal is reset and becomes reusable, display of the completed transfer is effected by the display device 313 as previously described. If, at this time, the charging of the battery E2 in the storing unit 2 has also been completed, the solenoid 320 operates to cause the storing unit 2 to be separated from the converter 3.

When it is desired that the image signal recorded on the tape 305 to be reproduced in the monitor 4, the reproduce key of the keyboard 303 is depressed. Thereupon, a signal reporting to that effect is sent from the keyboard 303 to the pulse generating circuit 306. In response thereto, the circuit 306 sends a motor starting signal and a synchronizing pulse to the motor driving circuit 316 to rotate the tape 305. The image signals corresponding to one frame which have been recorded on the tape 305 are read out and written into the buffer memory 314 through a reproducing multi-head 321a, a reproducing circuit 321 for amplifying the signal from said head and demodulating it into a digital signal, and the selecting gate 310. When this write-in is completed, the rotation of the tape 305 is stopped and also the image signals stored in the buffer memory 314 are repetitively read out and made into images by the monitor 4 through the D/A converter circuit 311 and NTSC converter circuit 312.

The detection of the fact that the image signals corresponding to one frame have all been transferred from the tape 305 to the buffer memory 314 is accomplished by the start signal detecting circuit 308 detecting that the start signal recorded at the top of the next image signal has appeared at the output of the reproducing circuit 321. (The wiring between the output terminal of the reproducing circuit 321 and the input terminal of the detecting circuit 308 is not shown.)

By operating the keyboard 303 before image signals are transferred from the storing unit 2 to the tape 305, it is possible to send a data signal such as date or the like to a signal processing circuit 309, make a signal comprising an image signal and a data synthesized together into an image in the monitor and record it on the tape 305.

The D/A converter circuit is provided with an output terminal which is connected to an apparatus for making into a hard copy the image signal converted into an analog signal.

The embodiment shown in FIGS. 19 to 24 is an electronic camera having a monitor device for reproducing and displaying the object image removably incorporated in the camera body. In this embodiment, the monitor device is provided with a release device for remotely operating the camera so that the camera is operable by the release device when the monitor device has been separated from the camera body. With such construction, the photographer can remotely operate the camera while accurately recognizing the object image with the aid of the monitor device.

Referring to FIGS. 19 and 20, the electric camera body 500 has a phototaking lens 510, and a solid state imaging sensing device such as CCD, not shown, is disposed in the focal plane thereof. The object image converted into an electrical signal by this solid state imaging sensing device is stored in a memory such as a semiconductor memory or a magnetic bubble memory contained in a storing unit 600. This storing unit 600 is removably mountable to the camera body 500 by means of a mounting-dismounting button 603, and has memories corresponding to, for example, twenty still pictures for storing the still picture electrical signals from the solid state imaging sensing device. This storing unit 600 is provided with a display portion 602 for displaying the number of stored memories, as shown in FIG. 20. The camera body 500 further has a finder window 512, a photography starting button or a release button 515, a shoe seat 514 for mounting a flash device, a camera side antenna 517 and a remote-operating switch button 519. A monitor device 400 is removably mounted on the back side of the camera body 500. This monitor device 400 has a matrix display member 423 comprising an electro-optical effect element such as liquid crystal, a change-over switch 425, a ten-key 427, a numerical dispaly portion 429 and a remote-operating release button 431. The matrix display member 423 reproduces the object image being picked up from the electrical signal of the image pickup device or reproduces the already stored object image from the electrical signals from the memories of the storing unit 600, and displays it. The change-over switch 425 selects which of the electrical signal from the image pickup device and the electrical signal from the memory is to be displayed by the matrix display member 423. The ten-key 427 and the numerical display portion 429 are such that when a numeral set by the ten-key 427 is displayed on the display portion 429 and the change-over switch 425 selects the memory side, the object information stored in the memory of the address corresponding to this numeral is displayed on the matrix display member 423. A remote-operating release button 431 is such that when the monitor device 400 has been removed from the camera body 500, the photography of the camera is started by operating a release button 413. As shown in FIG. 21B, the monitor device 400 further has a connector 433 for effecting give-and-take of a signal between the monitor device and the camera body and between the monitor device and the storing unit through the camera body, a restraining pawl 435 for restraining the monitor device 400 to the camera body 500, a mounting-dismounting button 437 for displacing the restraining pawl 435 and rendering the monitor device 400 removable from the camera body, a monitor side antenna 439, and a signal pin 441 used to discriminate whether the monitor device is mounted to the camera body. With such a construction, when the monitor device 400 is mounted to the camera body 500 by inserting an unshown guide groove of the monitor device 400 over the guide projection 543 of the camera body shown in FIG. 21A, the connector 433 is connected to an unshown connector of the camera body and the signal pin 441 is depressed to restrain the operation of the remote-operating release button 431 of the monitor device. When the change-over switch 425 is set to the image pickup device side, the display member 423 displays the present object image by the phototaking lens 510. When the camera side release button 515 is now depressed, the still picture of this object is recorded in a predetermined memory of the storing unit 600.

Next, where this electronic camera is to be remote-operated, the mounting-dismounting button 437 of the monitor device 400 is operated and the monitor device 400 is removed from the camera body. Thereby, the signal pin 441 rises to release the restraint of the remote-operating release button 431 of the monitor device. When the remote-operating switch button 519 of the camera is operated, the image electrical signal from the image pickup device is sent by the antenna 517 of the camera body. The monitor device 400 receives this image electrical signal by means of an antenna 439 and the matrix display member 423 displays the object image being now picked up. Thus, the photographer, even if he lies at a location remote from the camera body, can observe the image of the object to be photographed by means of this monitor device 400. Particularly, where the photographer himself stands in front of the camera and becomes an object, he can select his position by observation through this monitor device 400. Thereafter, when the remote-operating release button 431 of the monitor device 400 is depressed, this release signal is transmitted through antennae 439 and 517 to the camera body 500, which thus starts a photographing operation so that the object image is stored in the memory. During such photographing and storage operation, the monitor image on the display member 423 disappears to permit confirmation of the reception of the release signal, and then the monitor image again appears to inform the photographer of the completion of the next photography preparation. Of course, the display during the photographing and storage and the display of the completion of the photography preparation may be effected by another display device separate from the display member 423, which device may be provided on the monitor device 400. Also, this remote operation, instead of using radio as described above, may be carried out by connecting the monitor device side connector and the camera body side connector by means of a cable. If design is made such that the camera body starts photographing in a predetermined time after the release operation from the monitor device 400, there will conveniently be provided a time allowance for preventing the monitor device 400 from being photographed on the picture plane when the photographer himself has become an object as mentioned above. Instead of providing the remote-operating switch button 519 of the camera body 500, design may be made such that removal of the monitor device 400 from the camera body is detected by the signal pin 441 and the aforementioned radio signal for image is automatically generated.

FIGS. 22 to 24 show an embodiment further improved over the embodiment of FIGS. 19–21. A monitor device 700 is provided with a mounting-dismounting knob 737, a mounting screw 753 rotated thereby, a monitor side window 755, a release button 731, a monitor side connector 733, a monitor side antenna 739, and a signal pin 741. The release button 731 serves as an ordinary release button for starting photographing operation when the monitor device has been mounted to the camera body, and serves as a remote-operating release button when the monitor device has been removed from the camera body. Accordingly, in the present embodiment, the remote-operating release button 431 of the aforedescribed embodiment is unnecessary. The camera body 800 is provided with a phototaking lens 810, a finder window 812, a camera side antenna 817, a change-over lever 857, a monitor device mounting female screw 859, a camera side window 861 and a camera side connector 863.

As shown in FIG. 24, a monitoring Braun tube 765 and a fixed mirror 767 for reflecting light from the fluorescent surface of the Braun tube toward the monitor side window 755 are contained within the monitor device 700. The camera body 800 has therein a finder objective lens 869 disposed behind the finder window 812, an eyepiece 871 disposed rearwardly of the finder objective lens, a movable mirror 873 disposed between the lenses 869 and 871, and a positive lens 875 disposed rearwardly of the camera side window 861. The finder objective lens 869 and the eyepiece 871 together constitute a see-through finder through which an object can be directly observed, and the movable mirror 873 is connected to the change-over lever 857 so that it is retractable from the see-through finder light path in response to operation of the lever 857 to complete the see-through finder light path and that it comes into the light path to reflect light from the positive lens 875 toward the eyepiece 871. Unlike the embodiment of FIG. 19, memories for storing image signals therein are contained within the camera body.

With such a construction, when the knob 737 is turned and male screw 753 is brought into engagement with the female screw 859 and the monitor device 700 is mounted to the camera body 800, the monitor side connector 733 is coupled to the camera side connector 863 and the monitor side window 755 comes to face the camera side window 861. Accordingly, the object image reproduced and displayed on the Braun tube 765 may be observed through the fixed mirror 767, windows 755, 861, positive lens 875, movable mirror 873 and eyepiece 871. When the photographer desires to directly observe the object image through the see-through finder, he may operate the change-over lever 857 to retract the movable mirror 873 from the light path of the finder objective lens 869. By depressing the release button 731, release signal is transmitted to the camera body through connectors 733 and 863 and photography is started, whereby image signals are stored in the memories contained within the camera body.

On the other hand, when the monitor device 700 is removed from the camera body 800 as shown in FIG. 23, the monitor device receives the image signals from the camera side antenna 817 by the monitor side antenna 739 and reproduces and displays the image signals on the Braun tube 765. The photographer can directly observe this display from the monitor side window 755. When the release button 731 is depressed for the remote operation of the camera, release signal is transmitted to the camera body through antennae 739 and 817 and photography is effected. Where the Braun tube image as observed from the monitor side window 755 with the monitor device removed and the Braun tube image as observed from the eyepiece 871 with the monitor device mounted are reversed in vertical position relative to each other, an erect image can always be provided by changing the scanning direction of the Braun tube 765 by the signal pin 741 in response to the mounting of the monitor device. It is also possible that when the monitor device has been removed, the movable mirror 873 is pivotally moved in response to the removal operation thereof to form the light path of the see-through finders 869 and 871. Thus, in this embodiment, the release button 731 of the camera is installed with the monitor device and can therefore be used also as the remote-operating release button. Also, when the monitor device has been mounted to the camera body, both the monitor image and the see-through finder image can be observed through the eyepiece 871 by operation of the change-over lever and there is no necessity of keeping the eye away from the eyepiece 871 for the observation of the monitor image as in the previous embodiment.

The previously described embodiment has been a so-called still electronic camera which records still images, but it may of course be an electronic camera which records moving pictures.

In the previously descirbed embodiments, image signals are digitalized and stored in memory means, whereas the present invention is not restricted thereto but image signals may be stored while being analog signals. In this latter case, use of analog semiconductor memories as the memory means would be suitable because the movable portion becomes unnecessary.

We claim:
1. An electronic photographic camera comprising:
  (a) an optical system forming an image of an object to be photographed;
  (b) a solid state imaging sensing device including a plurality of light-receiving elements disposed in the imaging plane of said optical system and producing a charge corresponding to the quantity of incident light and accumulating the charge therein, first and second gate means for transferring the charge accumulated in said elements respectively, register means for putting out the charge transferred by the opening of said first gate means successively in time-series fashion correspondingly to each of said elements, and drain means for receiving the charge accumulated in said elements beyond a predetermined amount during the closing of said second gate means and receiving the charge produced in said elements during the opening of said second gate means;

(c) first and second gate control means for executing in a time sequential order a first control where said first gate means is closed and also said second gate means is opened, a second control where both said first and second gate means are closed for a perdetermined period and a third control where said first gate means is opened and also said second gate means is closed; and (d) means for metering the brightness of said object by the amount of charge drained from said drain means through said second gate means which is opened by said first control of said control means.

2. A camera according to claim 1, wherein said control means includes means responsive to said metering means for determining said predetermined period in said second control.

3. A camera according to claim 1, further comprising: diaphragm means provided in said optical system to adjust the quantity of light from said object reaching said light-receiving elements, said diaphragm means having an opening for passing light therethrough; and means responsive to said metering means and for driving said diaphragm means to vary the size of said opening.

4. A camera according to claim 1, wherein said metering means includes means operatively associated with said control means to store the result measured immediately before termination of said first control.

5. A camera according to claim 1, wherein said plurality of light-receiving elements are arranged in the form of a matrix, said first gate means is provided adjacent to the row of elements arranged along the row of said matrix said register means includes row direction shift register means provided adjacent to said first gate means and column direction shift register means connected to said row direction shift register means, said second gate means is provided adjacent to the row of said elements, said drain means is provided adjacent to said second gate means, and said drain means includes means for draining independently the charge produced in a light-receiving element disposed at a specific area of said matrix and said metering means meters the brightness out of said independently drained charge.

6. An electronic photographic camera comprising:
(a) an optical system forming an image of an object to be photographed;
(b) a solid state imaging sensing device including a plurality of light-receiving elements disposed in the imaging plane of said optical system and producing a charge corresponding to the quantity of incident light and accumulating the charge therein, first and second gate means for transferring the charge accumulated in said elements respectively, register means for putting out the charge transferred by the opening of said first gate means successively in time-series fashion corresponding to each of said elements, and drain means for receiving the charge accumulated in said elements beyond a predetermined amount during the closing of said second gate means and receiving the charge produced in said elements during the opening of said second gate means;
(c) first gate control means for closing said first gate means and opening said second gate means;
(d) means connected to said drain means for metering the brightness of said object on the basis of the charge received in said drain means to produce an output for said brightness;
(e) means for storing said output of said metering means; and
(f) second gate control means for closing both said first and second gate means for a predetermined period which is determined according to said stored output to accumulate the charge at said elements.

7. An electronic photographic camera comprising:
(a) an optical system forming an image of an object to be photographed;
(b) a solid state imaging sensing means including a plurality of light-receiving elements disposed in the imaging plane of said optical system and producing a charge corresponding to the quantity of incident light and accumulating said charge therein, first transfer means having a first output terminal and transferring the charge to said first output terminal, and second transfer means having a second output terminal and transferring the charge to said second output terminal;
(c) means for executing a first control to shift the charge generated at said light-receiving elements to said first transfer means;
(d) means for executing a second control subsequently to said first control execution to accumulate in each of said elements the charge generated at said light-receiving elements;
(e) means for metering the brightness of said object on the basis of the charge generated at said first output terminal during said first control to produce an output for said brightness; and
(f) means for storing the output produced at said metering means just before said second control execution.

8. A camera according to claim 7, further comprising:
means for determining a time period of said second control on the basis of the output stored in said storing means; and
means for executing a third control to shift the charge accumulated at said light-receiving elements to said second transfer means after said determined time period has elapsed.

9. An electronic photographic camera comprising:
(a) an optical system forming an image of an object to be photographed;
(b) a solid state imaging sensing means including a plurality of light-receiving elements disposed in the imaging plane of said optical system and producing a charge corresponding to the quantity of incident light and accumulating said charge therein, first transfer means having a first output terminal and transferring the charge to said first output terminal, and second transfer means having a second output terminal and transferring the charge to said second output terminal;
(c) means for executing a first control to shift the charge generated at said light-receiving elements to said first transfer means;
(d) means for executing a second control subsequently to said first control execution to accumulate in each of said elements the charge generated at said light-receiving elements;
(e) means for determining a time period of said second control on the basis of the charge generated from said first output terminal during said first control execution; and (f) means for executing a third control to shift the charge accumulated at said light-receiving elements after said determined time period has elapsed.

10. A camera according to claim 9, wherein said solid state imaging sensing device further comprises means for, when the charge accumulated in each of said light-receiving elements during said second control exceeds a predetermined quantity, shifting the excess of charge over said predetermined quantity to said first transfer means.

11. A camera according to claim 9, wherein said third control means shifts the charge of said light-receiving elements to said second transfer means independently for each of said elements and said second transfer means transfers the shifted charge to said second output terminal as a signal forming said object image.

12. An electronic photographic camera comprising:
(a) an optical system forming an image of an object to be photographed;
(b) image pickup means for converting the optical image of the object formed by said optical system into an electronic image signal;
(c) means for generating an index signal distinguished from said electronic image signal;
(d) solid state memory means;
(e) means for transferring said electronic image signal and said index signal to said memory means in the same timing;
(f) wherein said memory means has a first registration position to register said electronic image signal transferred by said transferring means and a second registration position to register said transferred index signal; and
(g) means for monitoring said second registration position to detect the registration of said index signal at said second registration position.

13. A camera according to claim 12, wherein said detecting means includes means for stopping the operation of said transfer means in response to the detection of said registration.

14. A camera according to claim 12, further comprising means driven in response to the detection of said index signal registration by said detecting means for displaying that said memory means has been already used due to the registration of said electronic image signal.

15. A camera according to claim 12, wherein said detecting means including means for unerasably holding the electronic image signal transferred to said memory means during the registration of said index signal in said second registration position.

16. A camera according to claim 15, further comprising means for resetting said second registration position to erase said index signal.

17. An electronic photographic camera comprising:
(a) an optical system forming an image of an object to be photographed;
(b) image pickup means including a plurality of light-receiving elements disposed in the imaging plane of said optical system and producing electrical signals corresponding to the quantity of incident light, and means for transferring each of said electrical signals in time-series fashion and thereby emitting them as still image signals;
(c) memory means for recording said still image signals;
(d) means for taking out a first still image signal recorded in said memory means, in time-series fashion;
(e) synthesizing means for synthesizing said first still image signal and a second still image signal put out from said image pickup means to thereby make a third still image signal; and
(f) means for re-transferring said third still image signal to said memory means.

18. A camera according to claim 17, wherein said memory means includes a plurality of memories each of which is provided for recording therein still image signals corresponding to one frame, and said re-transfer means re-transfers said third still image signal to the same memory as the memory in which said first still image signal was recorded.

19. A camera according to claim 17, wherein said synthesizing means includes means for producing, under the correspondence with respect to said light-receiving elements, an electrical signal corresponding to the arithmetical mean of each of said electrical signals contained in said first still image signal and each of said electrical signals contained in said second still image signal.

20. An electronic photographic camera comprising:
(a) an optical system forming an image of an object to be photographed;
(b) image pickup means for converting the optical image of the object formed by said optical system into an electronic image signal;
(c) memory means including a plurality of memories each of which being provided for recording said electronic image signal corresponding to a still image of the optical image of said object;
(d) means for generating a signal to release said camera;
(e) means in response to said release signal for successively searching said plurality of memories to detect at least one unused memory where said electronic image signal is not stored; and
(f) means in response to said release signal for transferring said electronic image signal from said image pickup means to said one detected unused memory.

21. A camera according to claim 20, wherein said detecting means includes warning means for generating an output signal in response to the termination of said search in case that there is no unused one in said plurality of memories.

22. An electronic photographic camera comprising:
(a) an optical system forming an image of an object to be photographed;
(b) image pickup means for converting the optical image of the object formed by said optical system into an electronic image signal;
(c) memory means including a plurality of memories each of which being provided for recording said electronic image signal corresponding to a still image of the optical image of said object, each of said plurality of memories including means for indicating that said electronic image signal has been stored therein;
(d) means for generating a signal to release said camera;
(e) detecting means in response to said release signal for successively searching said plurality of memories to produce an output when a memory without the indication of said indicating means is detected; and (f) means in response to the output of said detecting means for transferring said electronic image signal from said image pickup means to said detected memory.

23. An electronic photographic camera comprising:
(a) a camera housing;
(b) a phototaking lens unit mounted to said housing and including an optical system forming an image of an object to be photgraphed;
(c) image pickup means provided within said housing for converting the optical image of the object formed by said optical system into an electronic image signal;
(d) a storing unit including memory means including a plurality of memories each of which being provided for recording said electronic image signal corresponding to a still image of the optical image of said object, signal member representing the total number of said plurality of memories;
(e) means for releasing said camera, said camera releasing means comprising means for generating a release signal, means for detecting at least one unused memory where said electronic image signal from said plurality of memories is not stored, and means in response to said release signal for transferring said electronic image signal from said image pickup means to said one detected unused memory;
(f) counter means provided to respond to said release signal for counting from among said plurality of memories the number of memories in which said electronic image signal has already been recorded; and
(g) warning means coupled to said signal member and producing a warning when the number of memories counted by said counter means has become coincident with the number of memories represented by said signal member.

24. An electronic photographic camera comprising:
(a) an optical system forming an image of an object to be photographed;
(b) image pickup means for converting the optical image of the object formed by said optical system into an electronic image signal;
(c) memory means including a plurality of memories each of which being used to record said electronic image signal corresponding to a still image of the optical image of said object, each of said memories having a determined memory position in said memory means respectively; and
(d) display means having a plurality of display elements disposed at each of said plurality of memories in a position correspondence and means in response to the use for each of said plurality of memories for driving a corresponding display element, whereby the condition of use in said plurality of memories is displayed.

25. A camera according to claim 24, wherein each of said plurality of memories includes means for indicating that said electronic image signal has been recorded therein, and said driving means operates in response to the indication of said indicating means.

26. An electronic photographic camera comprising:
(a) an optical system forming an image of an object to be photographed;
(b) image pickup means for converting the optical image of the object formed by said optical system into an electronic image signal;
(c) memory means including a plurality of memories each of which being used to record said electronic image signal corresponding to a still image of the optical image of said object; and
(d) means for visually indicating the condition of use in said plurality of memories, said indicating means comprising means for detecting that each of said plurality of memories has been used to record said electronic image signal, a plurality of display elements correspondingly provided for each of said plurality of memories, and means in response to the detection of said detecting means for driving display elements used for said recording.

27. An electronic photographic camera converting an optical image of a object into an electronic image signal and storing said electronic image signal, which comprises:
(a) a first unit including a first housing and electric circuit means;
(b) a second unit including a second housing power supply battery means;
(c) first connecting means for electrically connecting said electric circuit means with said battery means;
(d) second connecting means for mechanically connecting said first housing with said second housing;
(e) means for manually operating said circuit means during said electrical connection; and
(f) means for holding said mechanical connection in accordance with said operating means.

28. A camera according to claim 27, wherein said first unit includes memory means for recording said electronic image signal therein and said circuit means has means for supplying the power of said battery means to said memory means.

29. A camera according to claim 27, wherein said second unit includes image pickup means for converting said optical image into said electronic image signal and means for supplying the power of said battery means to said image pickup means.

30. A camera according to claim 27, wherein said manually operated means produces an operation signal in response to said manual operation, and said holding means includes an electromagnetic device driven by said operation signal.

31. An electronic photographic camera system comprising:
(a) a camera including an optical system forming an image of an object to be photographed, image pickup means for converting the optical image of the object formed by said optical system into an electronic image signal, memory means for recording said electronic image signal corresponding to a still image of said optical image, and a power supply battery for supplying power to at least one of said image pickup means and said memory means; and
(b) a converter including means for coupling to said camera, a connector for connecting to another memory, means for recording said electronic image signal, means for transferring to said another memory means the electronic image signal recorded in said memory means of said camera during the coupling of said converter to said camera, and means for charging said power supply battery during the coupling of said converter to said camera.

32. A camera system according to claim 31, wherein said memory means of said camera includes a volatile memory backed up by said power supply battery.

33. A camera system according to claim 32, wherein said camera includes a first housing including said image pickup means, a second housing including said memory means and said power supply battery, means for coupling said first and second housings to each other and means for connecting said image pickup means and said memory means during said coupling of said first and second housings, and said second housing having a connector for connecting with said connector of said converter.

34. A camera system according to claim 33, wherein each of said connectors of said second housing and said converter includes a first transmission line for connecting said memory means of said second housing and said transfer means, a second transmission line for connecting said power supply battery and said charging means, and third transmission line for connecting said memory means of said second housing and said charging means.

35. A camera system according to claim 31, wherein said converter includes means for detecting completion of the transfer by said transfer means and completion of the charging by said charging means, and display means responsive to said detecting means.

36. An electronic photographic camera comprising:
(a) a camera unit including a first housing means for forming the optical image of an object to be photographed, image pickup means for converting said optical image into an electronic image signal, means for electrically energizing said image pickup means to start the operation of said image pickup means and means for emitting said electronic image signal outside of said first housing;
(b) a monitor device including a second housing means for receiving said electronic image signal emitted from said first housing into said second housing, means for reproducing said electronic image signal and visibly displaying said object and operating means for producing an operation signal and for emitting said operation signal outside of said second housing; and
(c) said camera unit further including means for receiving said operation signal into said first housing and said electrically energizing means actuating in response to said operation signal.

37. A camera according to claim 36, wherein said camera unit further includes memory means for recording said electronic image signal and said electrically energizing means energizes said memory means to start said recording in response to said operation signal.

38. A camera according to claim 36, further comprising means for coupling said first and second housings to each other, said coupling means having means for restraining said operating means during said coupling.

39. An electronic photographic camera comprising:
(a) an image pickup unit including a first housing, optical means for forming an image of an object to be photographed, image pickup means for converting the optical image of the object formed by said optical system into an electronic image signal, and first power supply battery means for supplying power to said image pickup means;
(b) a storing unit including a second housing, volitile memory means for recording said electronic image signal corresponding to a still image of the optical image of said object, and second power supply battery means for supplying power to said volatile memory means;
(c) first coupling means for mechanically coupling said first housing with said second housing;
(d) second coupling means for electrically coupling, during said mechanical coupling, both of said image pickup means and said first power supply battery means with said volatile memory means; and
(e) means for cutting off the power supply from said second power supply battery means to said volatile memory means in response to said second coupling means.

40. An electronic photographic camera system comprising:
(a) an optical system forming an image of an object to be photographed;
(b) image pickup means for converting the optical image of the object formed by said optical system into an electronic image signal;
(c) storing means including a plurality of memories each of which registering said electronic image signal corresponding to a still image of said optical image;
(d) means for reproducing said electronic image signal and visibly displaying said object;
(e) means for transferring said electronic image signal from each of said memories into said reproducing means; and
(f) means for marking the memory registering therein said electronic image signal corresponding to said object which is being displayed by said reproducing means, said marking means having manually operated means for actuating said marking means.

41. A camera system according to claim 40, further comprising another storing means for recording said electronic image signal and another transfer means for transferring said electronic image signal registered in said memory marked by said marking means into said another storing means.

42. A camera system according to claim 41, wherein said system further comprises means for generating an index signal distinguished from said electronic image signal and means for transferring said index signal into each of said memories with said electronic image signal from said image pickup means, and said marking means includes means for eliminating said index signal from said memory.

43. An electronic photographic system for recording still images of objects, each of said still images being formed by an image forming optical device and converted into an electronic image signal, said system comprising:
(a) first storing means including a plurality of memories each of which registers said electronic image signal;
(b) second storing means for recording said electronic image signal;
(c) means for editing said still images registered in said plurality of memories; and
(d) said editing means including means for reproducing said electronic image signal and visibly displaying the corresponding object, manual operating means, first transfer means for transferring said electronic image signal in response to the manual operation of said operating means from each of said memories into said reproducing means, means responsive to another manual operation of said operating means for marking the memory registering therein said electronic image signal which is being reproduced by said reproducing means, and second transfer means for transferring said electronic image signal registered in said memory being marked by said marking means into said second storing means.

44. A camera system for photographing a still or a moving picture of an object, comprising:
   (a) a camera unit including a first housing, means for forming the optical image of said object to be photographed, image pickup means for converting said optical image into an electronic image signal and means for emitting said electronic image signal outside of said first housing;
   (b) a view finder unit including a second housing separated from said first housing, means for receiving said electronic image signal emitted from said first housing into said second housing and means for reproducing said electronic image signal and visibly displaying said object;
   (c) operating means provided on said second housing for producing an operation signal to drive said camera unit and for emitting said operation signal outside of said second housing;
   (d) an image recording unit connected with said camera unit including means for storing said electronic image signal;
   (e) control means provided on said first housing for receiving said operation signal and for controlling said camera unit and said image recording unit in response to said operation signal; and
   (f) means for coupling said view finder unit with said camera unit.

45. A camera system according to claim 44, wherein said coupling means includes means for engaging said second housing with said first housing, first connecting means for connecting said receiving means with said electronic image signal emitting means furing the engagement by said engaging means and second connecting means for connecting said receiving means with said electronic image signal emitting means and connecting said operating means with said control means during the separation of said second housing from said first housing.

46. A camera system for photographing a still or a moving picture of an object, comprising:
   (a) an image recording unit provided with a first housing;
   (b) a view finder unit provided with a second housing separated from said first housing;
   (c) transmission means provided between said first and second housings;
   (d) image pickup means for forming a video signal representing said picture of said object;
   (e) means provided in said first housing for storing said video signal;
   (f) means for emitting said video signal into said second housing through said transmission means;
   (g) visible display means provided in said second housing for receiving said video signal from said transmission means and reproducing said picture of said object;
   (h) operating means provided on said second housing for producing an operation signal to drive said image pickup unit and emitting said operation signal into said first housing through said transmission means; and
   (i) control means provided on said first housing for receiving said operation signal from said transmission means and controlling said storing means in response to said operation signal.

* * * * *